(12) United States Patent
Lee

(10) Patent No.: US 12,057,165 B2
(45) Date of Patent: Aug. 6, 2024

(54) METHOD OF PROGRAMMING A SELECT TRANSISTOR OF A SEMICONDUCTOR MEMORY DEVICE

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 52 days.

(21) Appl. No.: 17/879,975

(22) Filed: Aug. 3, 2022

(65) Prior Publication Data
US 2023/0298666 A1 Sep. 21, 2023

(30) Foreign Application Priority Data
Mar. 15, 2022 (KR) .................. 10-2022-0032270

(51) Int. Cl.
| | | |
|---|---|---|
| G11C 16/10 | (2006.01) | |
| G11C 16/04 | (2006.01) | |
| G11C 16/30 | (2006.01) | |
| G11C 16/34 | (2006.01) | |

(52) U.S. Cl.
CPC ...... *G11C 16/0433* (2013.01); *G11C 16/0483* (2013.01); *G11C 16/10* (2013.01); *G11C 16/102* (2013.01); *G11C 16/30* (2013.01); *G11C 16/3404* (2013.01)

(58) Field of Classification Search
CPC ... G11C 16/0433; G11C 16/102; G11C 16/30; G11C 16/3404; G11C 16/08; G11C 16/24; G11C 16/10; G11C 16/0483; H10B 41/41
See application file for complete search history.

(56) References Cited

U.S. PATENT DOCUMENTS

2017/0278571 A1* 9/2017 Chowdhury .......... H10B 43/27

FOREIGN PATENT DOCUMENTS

| KR | 101965709 B1 | 8/2019 |
|---|---|---|
| KR | 1020200115800 A | 10/2020 |

\* cited by examiner

*Primary Examiner* — Jay W. Radke
(74) *Attorney, Agent, or Firm* — WILLIAM PARK & ASSOCIATES LTD.

(57) ABSTRACT

A semiconductor memory device includes a first cell string, a second cell string, a peripheral circuit, and a control logic. The first cell string includes first and second drain select transistors. The second cell string includes third and fourth drain select transistors. The peripheral circuit performs a program operation on the fourth drain select transistor included in the second cell string. The threshold voltage of the first drain select transistor is set through an ion implantation process. The threshold voltage of the fourth drain select transistor is set through the program operation.

16 Claims, 28 Drawing Sheets

FIG. 5
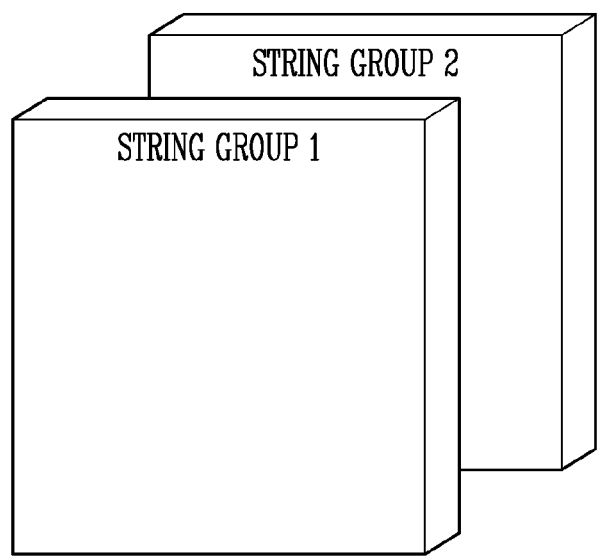
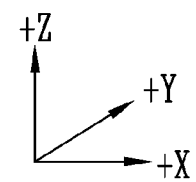

| Selected CS | DSLa | DSLb | Turn-on | Turn-off |
|---|---|---|---|---|
| CS11 | VON1 | VON2 | DST11, DST12, DST22 | DST21 |
| CS21 | VON2 | VON1 | DST11, DST21, DST22 | DST12 |

| Selected CS | DSLa | DSLb | Turn-on | Turn-off |
|---|---|---|---|---|
| CS11 | VON1 | VON3 | DST11, DST12, DST22 | DST21 |
| CS21 | VON2 | VON1 | DST11, DST21, DST22 | DST12 |

| Selected CS | DSLa | DSLb | DSLc | Turn-on | Turn-off |
|---|---|---|---|---|---|
| CS11 | VON1 | VON2 | VON1 | DST11, DST12, DST22, DST13 | DST21, DST23 |
| CS21 | VON2 | VON1 | VON2 | DST11, DST21, DST22, DST13, DST23 | DST12 |

FIG. 19B

| Selected CS | DSLa | DSLb | DSLc | Turn-on | Turn-off |
|---|---|---|---|---|---|
| CS11 | VON1 | VON3 | VON1 | DST11, DST12, DST22, DST13 | DST21, DST23 |
| CS21 | VON2 | VON1 | VON2 | DST11, DST21, DST22, DST13, DST23 | DST12 |

FIG. 20

START
↓
IMPLANT ION FIRST DRAIN SELECT TRANSISTOR INCLUDED IN FIRST CELL STRING AMONG PLURALITY OF DRAIN SELECT TRANSISTORS CONNECTED TO FIRST DRAIN SELECT LINE — S101
↓
PROGRAM SECOND DRAIN SELECT TRANSISTOR INCLUDED IN SECOND CELL STRING AMONG PLURALITY OF DRAIN SELECT TRANSISTORS CONNECTED TO SECOND DRAIN SELECT LINE — S301
↓
PROGRAM THIRD DRAIN SELECT TRANSISTOR INCLUDED IN FIRST CELL STRING AMONG PLURALITY OF DRAIN SELECT TRANSISTORS CONNECTED TO THIRD DRAIN SELECT LINE — S501
↓
END

METHOD OF PROGRAMMING A SELECT TRANSISTOR OF A SEMICONDUCTOR MEMORY DEVICE

CROSS-REFERENCE TO RELATED APPLICATION

The present application claims priority under 35 U.S.C. § 119(a) to Korean patent application number 10-2022-0032270, filed on Mar. 15, 2022, in the Korean Intellectual Property Office, the entire disclosure of which is incorporated herein by reference.

BACKGROUND

1. Technical Field

The present disclosure relates to an electronic device, and more particularly, to a method of programming a select transistor of a semiconductor memory device.

2. Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional memory device is a memory device designed in order to resolve a limit of an integration degree of a two-dimensional memory device and may include a plurality of memory cells that are vertically stacked on a semiconductor substrate.

SUMMARY

According to an embodiment of the present disclosure, a semiconductor memory device may include a first cell string, a second cell string, a peripheral circuit, and a control logic. The first cell string may include first and second drain select transistors. The second cell string may include third and fourth drain select transistors. The peripheral circuit may perform a program operation on the fourth drain select transistor included in the second cell string. Control logic may control the program operation of the peripheral circuit. Gates of the first and third drain select transistors may be connected to a first drain select line, and gates of the second and fourth drain select transistors may be connected to a second drain select line. Each threshold voltage of the second and third drain select transistors may correspond to a first state, and each threshold voltage of the first and fourth drain select transistors may be greater than the first state. The threshold voltage of the first drain select transistor may be set through an ion implantation process. The threshold voltage of the fourth drain select transistor may be set through the program operation.

According to another embodiment of the present disclosure, a drain select transistor included in a semiconductor memory device may be programmed by a program method. The program method may include implanting an ion into a first drain select transistor included in a first cell string among first and second drain select transistors connected to a first drain select line and programming a fourth drain select transistor included in a second cell string among third and fourth drain select transistors connected to a second drain select line.

BRIEF DESCRIPTION OF THE DRAWINGS

FIG. 5 is a diagram illustrating an example of a string group configuring a memory block.

FIGS. 18A and 18B are diagrams illustrating an embodiment of a method of operating the cell string after the threshold voltage control described with reference to FIGS. 15A to 17B.

FIGS. 19A and 19B are diagrams illustrating another embodiment of a method of operating the cell string after the threshold voltage control described with reference to FIGS. 15A to 17B.

FIG. 20 is a flowchart illustrating a method of programming a select transistor according to another embodiment of the present disclosure.

DETAILED DESCRIPTION

Specific structural or functional descriptions of embodiments according to the concept which are disclosed in the present specification or application are illustrated only to describe the embodiments according to the concept of the present disclosure, and the embodiments according to the concept of the present disclosure may be implemented in various forms and should not be construed as being limited to the embodiments described in the present specification or application.

In the description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure.

An embodiment of the present disclosure provides a semiconductor memory device having a drain select transistor having an improved threshold voltage distribution.

Another embodiment of the present disclosure provides a program method capable of improving a threshold voltage distribution of a drain select transistor.

The present technology, in an embodiment, may provide a semiconductor memory device having a drain select transistor having an improved threshold voltage distribution.

In addition, the present technology may provide, in an embodiment, a program method capable of improving a threshold voltage distribution of the drain select transistor.

Figure 1:
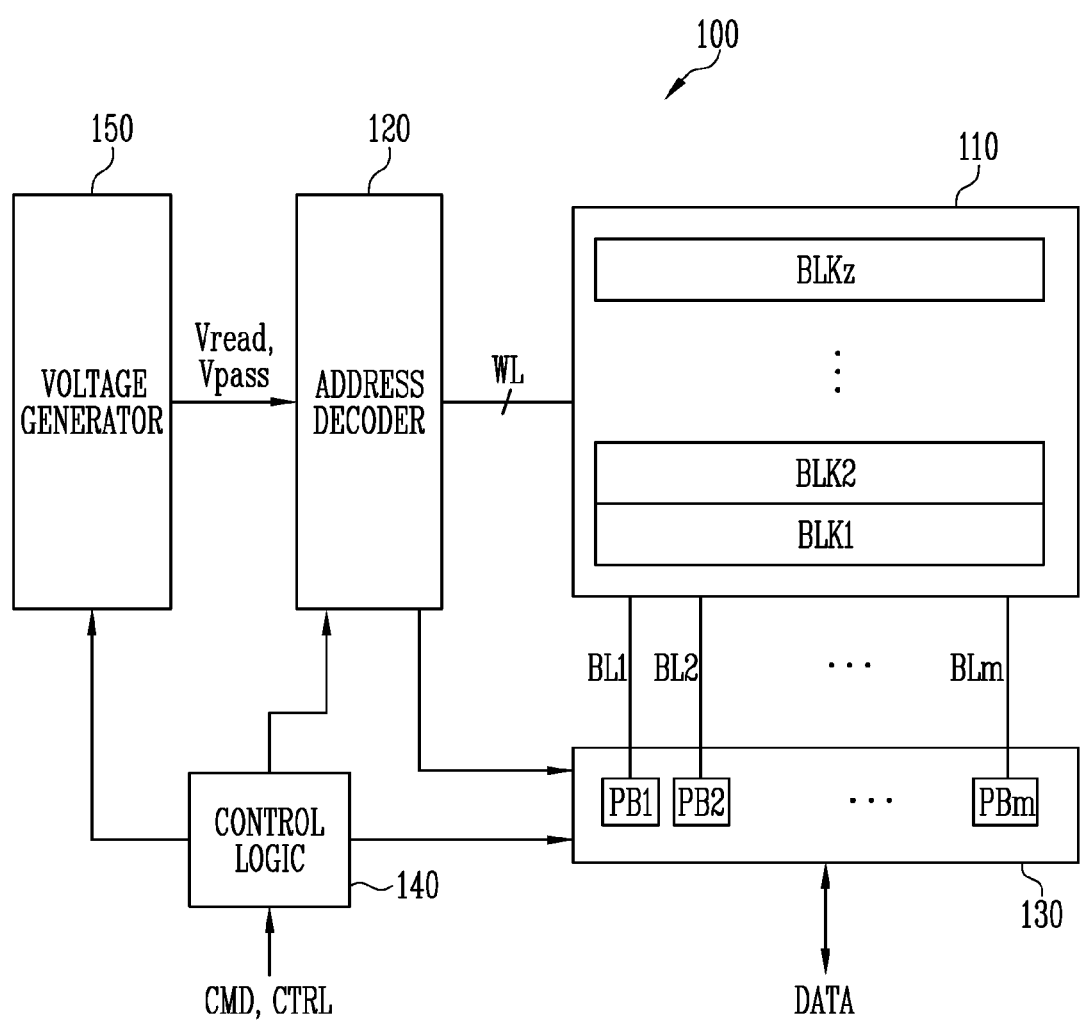
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read and write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, and the voltage generator 150 operate as a peripheral circuit that drives the memory cell array 110. The peripheral circuit may perform a read operation, a write operation, and an erase operation on the memory cell array 110 based on control of the control logic 140. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line among the selected memory block at a read voltage application operation during a read operation and applies a pass voltage Vpass to the remaining unselected word lines. In addition, the address decoder 120 applies a verify voltage generated by the voltage generator 150 to the selected word line among the selected memory block and applies the pass voltage Vpass to the remaining unselected word lines during a program verify operation.

The address decoder 120 is configured to decode a column address of the received addresses. The address decoder 120 transmits the decoded column address to the read and write circuit 130.

The read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. As an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage and generate the plurality of voltages by selectively activating the plurality of pumping capacitors in response to the control of the control logic 140.

Figure 2:
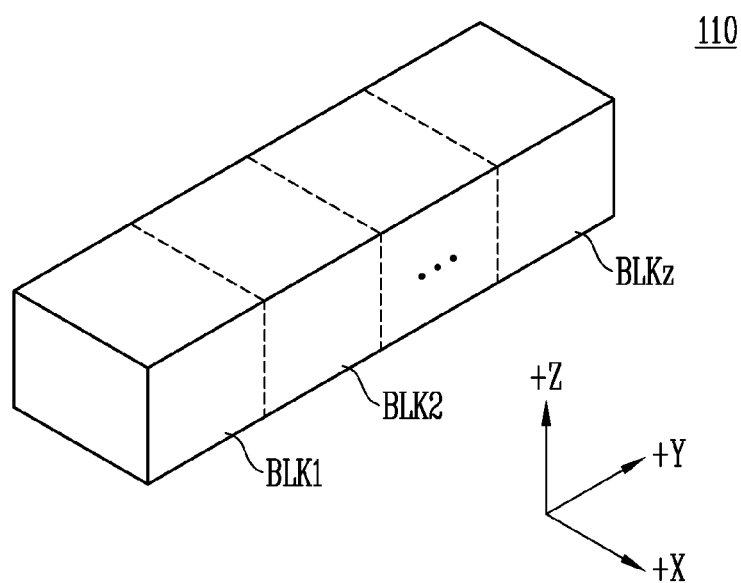
FIG. 2 is a diagram illustrating an embodiment of a memory cell array of FIG. 1.

FIG. 2 is a diagram illustrating an embodiment of the memory cell array of FIG. 1.

Referring to FIG. 2, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in with reference to FIGS. 3 and 4.

Figure 3:
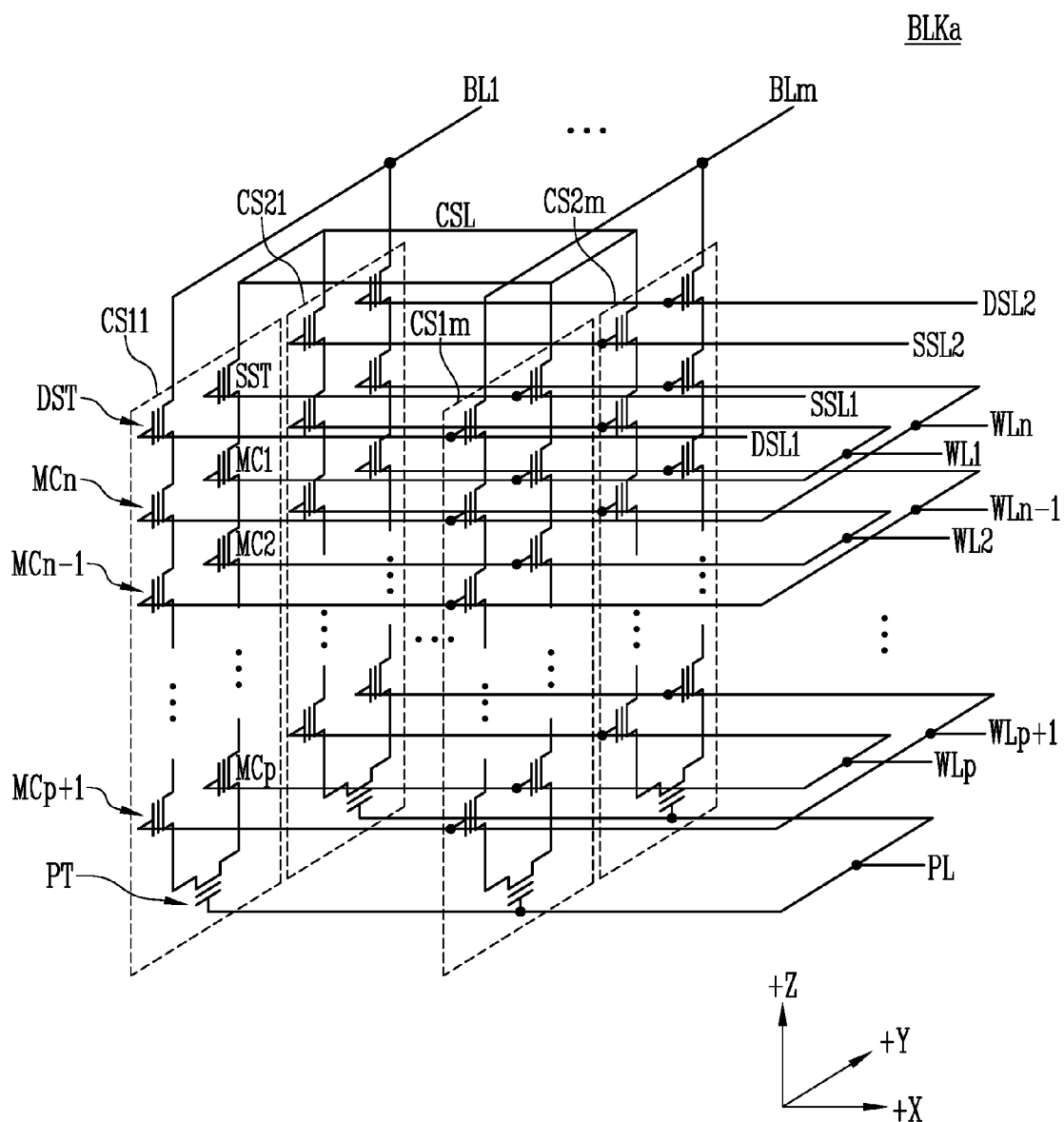
FIG. 3 is a circuit diagram illustrating any one memory block BLKa among memory blocks BLK1 to BLKz of FIG. 2.

FIG. 3 is a circuit diagram illustrating any one memory block BLKa among the memory blocks BLK1 to BLKz of FIG. 2.

Referring to FIG. 3, the memory block BLKa includes a plurality of cell strings CS11 to CS1m and CS21 to CS2m. As an embodiment, each of the plurality of cell strings CS11 to CS1m and CS21 to CS2m may be formed in a 'U' shape. In the memory block BLKa, m cell strings are arranged in a row direction (that is, the +X direction). In FIG. 3, two cell strings are arranged in a column direction (that is, the +Y direction). However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and each of the memory cells MC1 to MCn may have a similar structure. As an embodiment, each of the select transistors SST and DST and each of the memory cells MC1 to MCn may include a channel layer, a tunneling insulating layer, a charge storage layer, and a blocking insulating layer. As an embodiment, a pillar for providing the channel layer may be provided in each cell string. As an embodiment, a pillar for providing at least one of the channel layer, the tunneling insulating layer, the charge storage layer, and the blocking insulating layer may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 3, the source select transistors of the cell strings CS11 to CS1m of a first row are connected to a first source select line SSL1. The source select transistors of the cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. Cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 3, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1$m$ or CS21 to CS2$m$ arranged in the row direction may be connected to even bit lines, and odd-numbered cell strings among the cell strings CS11 to CS1$m$ or CS21 to CS2$m$ arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less dummy memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed.

Figure 4:
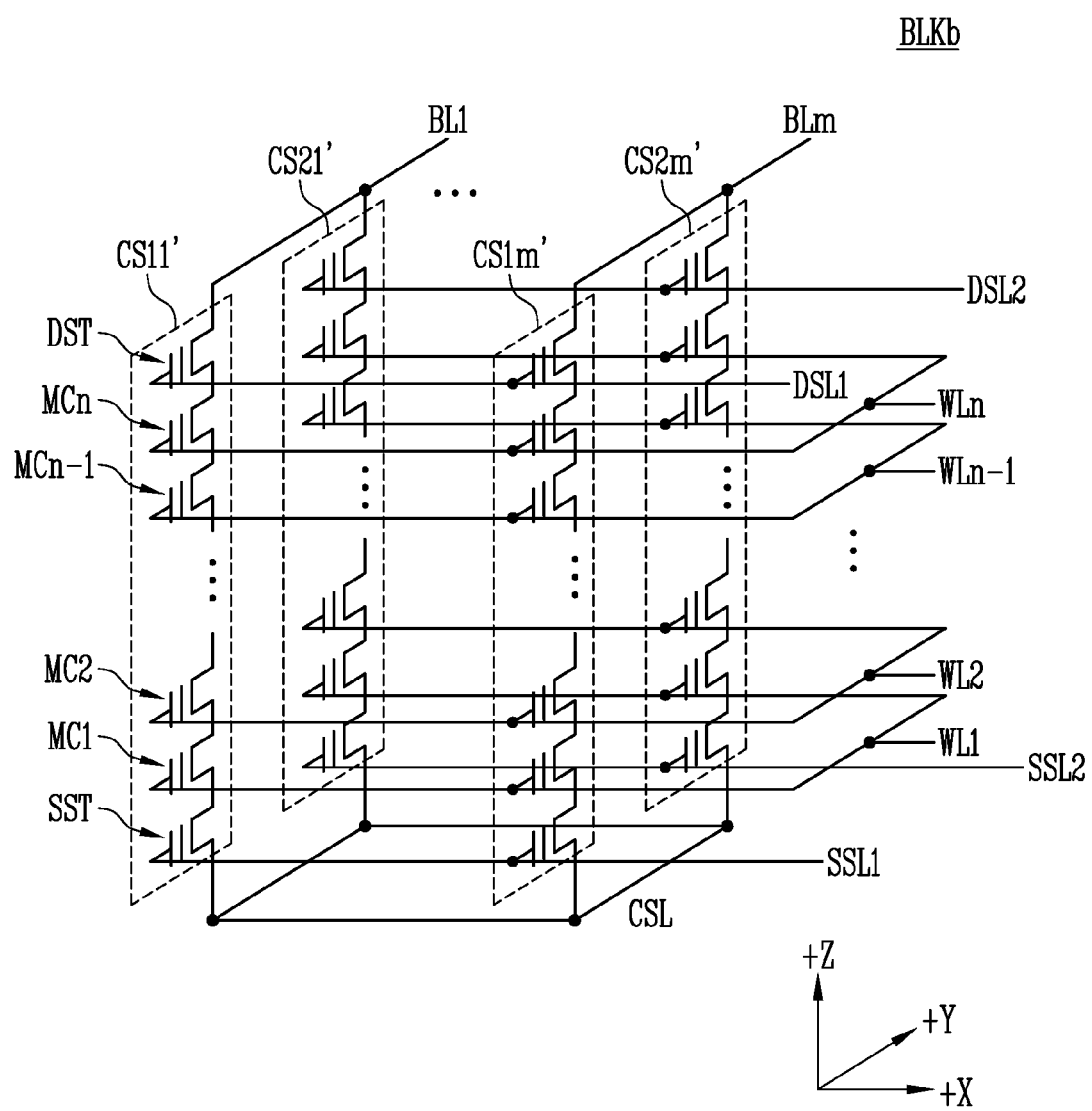
FIG. 4 is a circuit diagram illustrating another embodiment of any one memory block BLKb among the memory blocks BLK1 to BLKz of FIG. 2.

FIG. 4 is a circuit diagram illustrating another embodiment of any one memory block BLKb among the memory blocks BLK1 to BLKz of FIG. 2.

Referring to FIG. 4, the memory block BLKb includes a plurality of cell strings CS11' to CS1$m$' and CS21' to CS2$m$'. Each of the plurality of cell strings CS11' to CS1$m$' and CS21' to CS2$m$' extends along a +Z direction. Each of the plurality of cell strings CS11' to CS1$m$' and CS21' to CS2$m$' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1$m$' arranged in a first row are connected to a first source select line SSL1. The source select transistors of the cell strings CS21' to CS2$m$' arranged in a second row are connected to a second source select line SSL2. As another embodiment, the source select transistors of the cell strings CS11' to CS1$m$' and CS21' to CS2$m$' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1$m$' of a first row are connected to a first drain select line DSL1. The drain select transistors of the cell strings CS21' to CS2$m$' of a second row are connected to a second drain select line DSL2.

As a result, the memory block BLKb of FIG. 4 has an equivalent circuit similar to that of the memory block BLKa of FIG. 3 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1$m$' or CS21' to CS2$m$' arranged in the row direction may be connected to even bit lines, and odd-numbered cell strings among the cell strings CS11' to CS1$m$' or CS21' to CS2$m$' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less dummy memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed.

FIG. 5 is a diagram illustrating an example of a string group configuring a memory block.

Referring to FIG. 5, string groups STRING GROUP 1 and STRING GROUP 2 included in the memory blocks BLKa and BLKb shown in FIG. 3 or 4 are shown. For example, referring to FIG. 3 together, a string group included in the memory block BLKa may be defined as cell strings sharing a drain select line or a source select line. For example, in FIG. 3, the cell strings CS11 to CS1$m$ sharing the first drain select line DSL1 and the first source select line SSL1 may configure a first string group STRING GROUP 1. Meanwhile, the cell strings CS21 to CS2$m$ sharing the second drain select line DSL2 and the second source select line SSL2 may configure a second string group STRING GROUP 2.

As another example, in FIG. 4, the cell strings CS11' to CS1$m$' sharing the first drain select line DSL1 and the first source select line SSL1 may configure the first string group STRING GROUP 1. Meanwhile, the cell strings CS21' to CS2$m$' sharing the second drain select line DSL2 and the second source select line SSL2 may configure the second string group STRING GROUP 2. The memory block includes the two string groups STRING GROUP 1 and STRING GROUP 2 disposed in the +Y direction. Each of the string groups STRING GROUP 1 and STRING GROUP 2 includes cell strings arranged in a row direction (that is, the +X direction). Meanwhile, each of the string groups STRING GROUP 1 and STRING GROUP 2 includes pages arranged in a string direction (that is, the +Z direction). A more detailed configuration of each string group is described later with reference to FIGS. 6A and 6B.

Figure 6A:
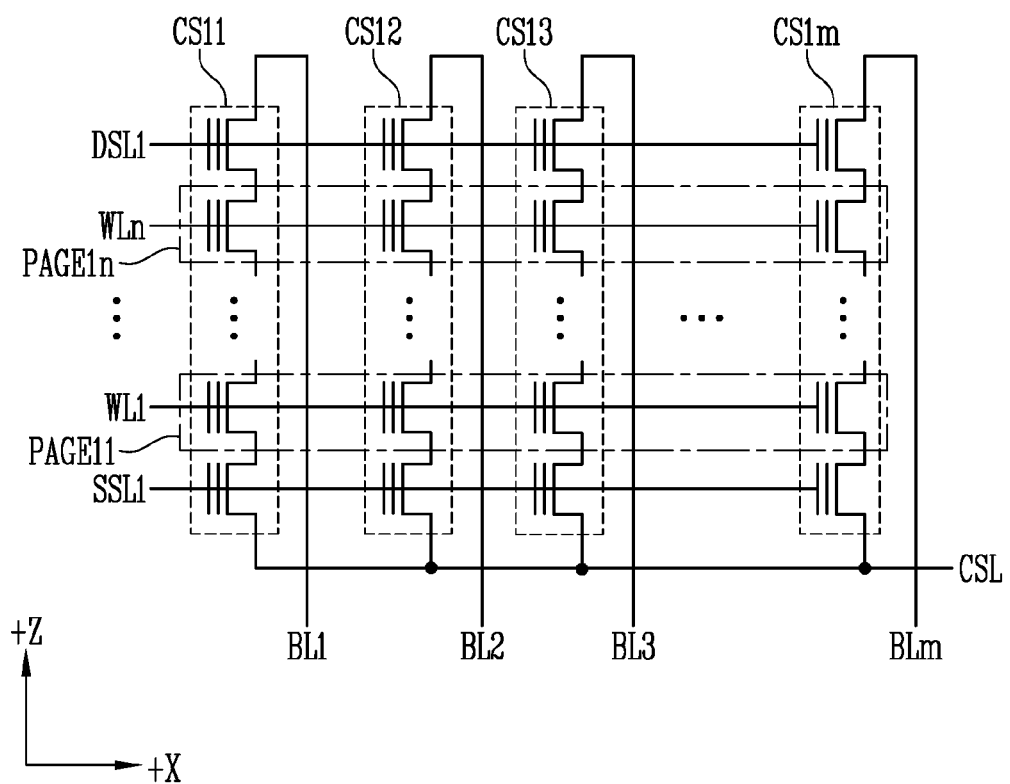
FIG. 6A is a circuit diagram illustrating a first string group among string groups shown in FIG. 5 in more detail.

FIG. 6A is a circuit diagram illustrating the first string group among the string groups shown in FIG. 5 in more detail. Since the second string group may also be configured identically to the first string group, a detailed circuit diagram of the second string group is omitted.

Referring to FIG. 6A, the first string group STRING GROUP 1 includes the cell strings CS11 to CS1m sharing the first drain select line DSL1 and the first source select line SSL1. That is, the cell strings CS11 to CS1m included in the first string group STRING GROUP 1 are commonly connected to the first drain select line DSL1 and the first source select line SSL1. The cell strings CS11 to CS1m are arranged in the +X direction in the first string group STRING GROUP 1. The respective cell strings CS11 to CS1m are connected to the corresponding bit lines BL1 to BLm.

Meanwhile, the first string group STRING GROUP 1 includes pages PAGE11 to PAGE1n arranged in the +Z direction. The respective pages PAGE11 to PAGE1n may be a set of memory cells connected to the corresponding word lines WL1 to WLn.

Although not shown in FIG. 6A, the second string group STRING GROUP 2 may also include the cell strings CS21 to CS2m arranged in the +X direction. Meanwhile, the second string group STRING GROUP 2 may include pages PAGE21 to PAGE2n arranged in the +Z direction.

Figure 6B:
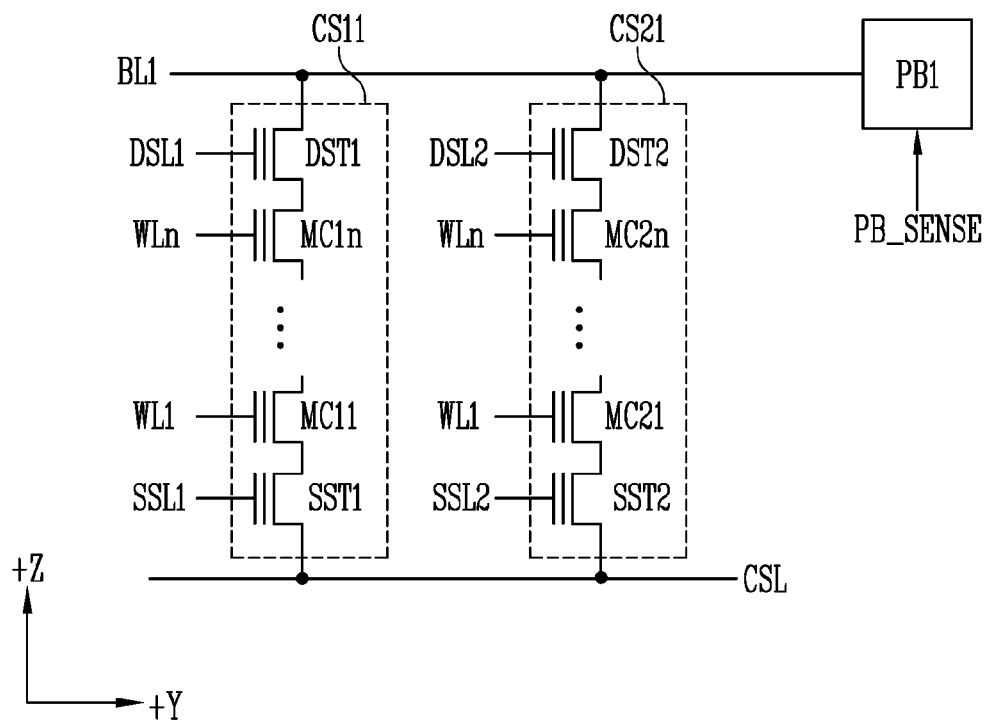
FIG. 6B is a circuit diagram illustrating a portion of a cell string included in first and second string groups.

FIG. 6B is a circuit diagram illustrating a portion of the cell string included in the first and second string groups.

Referring to FIG. 6B, the cell string CS11 included in the first string group STRING GROUP 1 and the cell string CS21 included in the second string group STRING GROUP 2 are shown. FIG. 6B may be a circuit diagram illustrating the memory block shown in FIG. 5 in the +X direction. Therefore, in FIG. 6B, the cell strings CS12 to CS1m included in the first string group STRING GROUP 1 and the cell strings CS22 to CS2m included in the second string group STRING GROUP 2 are not shown.

The cell string CS11 of the first string group STRING GROUP 1 includes memory cells MC11 to MC1n connected between a first drain select transistor DST1 and a first source select transistor SST1. The cell string CS21 of the second string group STRING GROUP 2 includes memory cells MC21 to MC2n connected between a second drain select transistor DST2 and a second source select transistor SST2.

The cell string CS11 included in the first string group STRING GROUP 1 and the cell string CS21 included in the second string group STRING GROUP 2 are commonly connected to the bit line BL1. Meanwhile, the page buffer PB1 is commonly connected to the bit line BL1. That is, the cell string CS11 included in the first string group STRING GROUP 1 and the cell string CS21 included in the second string group STRING GROUP 2 may share the page buffer PB1. The page buffer PB1 may operate based on a PB_SENSE signal. Meanwhile, although not shown in FIG. 6B, the page buffer PB1 may operate based on a plurality of control signals other than the PB_SENSE signal.

According to a cell string structure shown in FIG. 6B, the cell string CS11 included in the first string group STRING GROUP 1 and the cell string CS21 included in the second string group STRING GROUP 2 may be controlled by different select lines, respectively. For example, the first drain select transistor DST1 of the cell string CS11 included in the first string group STRING GROUP 1 is controlled by the first drain select line DSL1 and the second drain select transistor DST2 of the cell string CS21 included in the second string group STRING GROUP 2 is controlled by the second drain select line DSL2. In this case, drain select lines for respectively controlling drain select transistors of cell strings belonging to different string groups are required to be individually formed. In an embodiment, this may become a reason of an increase of a manufacturing cost of the memory cell array 110 of the semiconductor memory device 100.

Figure 7:
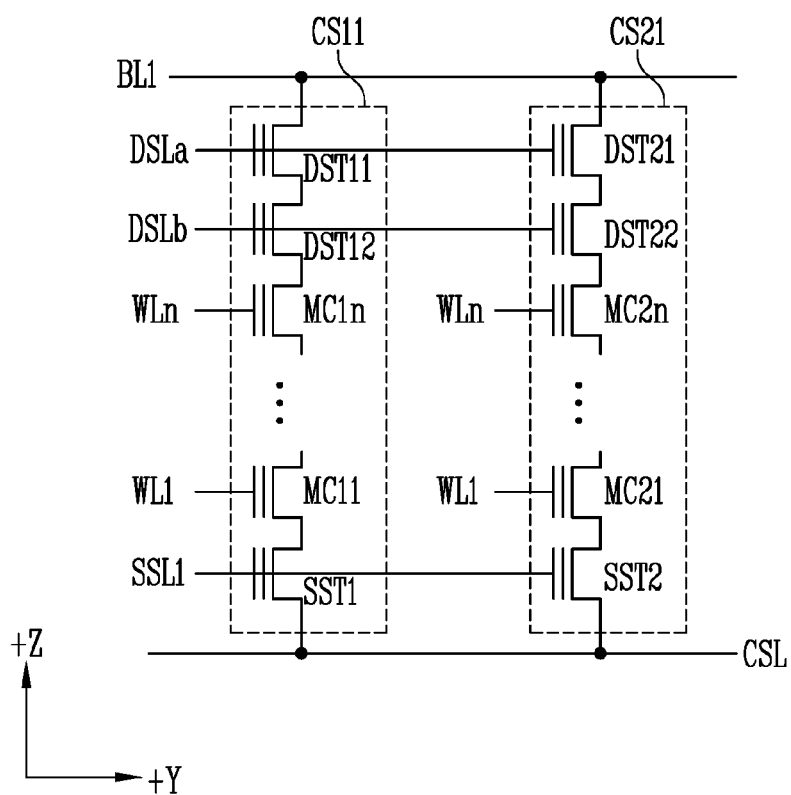
FIG. 7 is a circuit diagram illustrating a portion of a cell string included in first and second string groups according to an embodiment of the present disclosure.

FIG. 7 is a circuit diagram illustrating a portion of a cell string included in first and second string groups according to an embodiment of the present disclosure.

Referring to FIG. 7, the cell string CS11 includes two drain select transistors DST11 and DST12, and the cell string CS21 also includes two drain select transistors DST21 and DST22. Meanwhile, the drain select transistor DST11 of the cell string CS11 and the drain select transistor DST21 of the cell string CS21 are commonly connected to a drain select line DSLa. In addition, the drain select transistor DST12 of the cell string CS11 and the drain select transistor DST22 of the cell string CS21 are commonly connected to a drain select line DSLb. As described above, the drain select lines may be commonly connected to the drain select transistors of the cell strings belonging to the different string groups. In this embodiment, since the drain select lines positioned at the same height in the +Z direction are commonly connected to the drain select transistors included in the different cell string groups, the manufacturing cost of the memory cell array 110 of the semiconductor memory device 100 may be reduced.

Figures 8A, 8B:
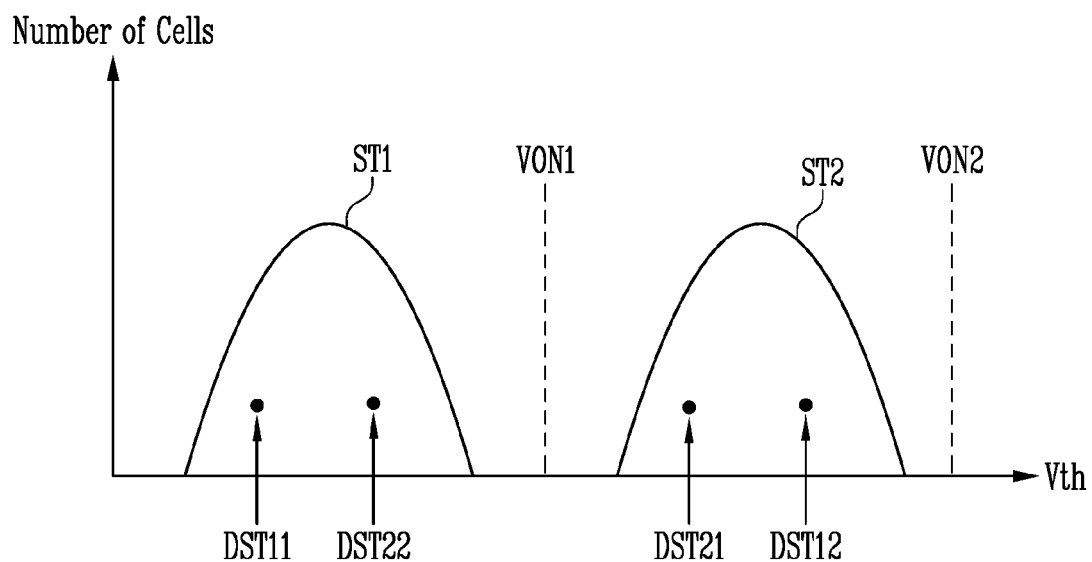
FIGS. 8A and 8B are diagrams illustrating a method of operating the cell string shown in FIG. 7.

FIGS. 8A and 8B are diagrams illustrating a method of operating the cell string shown in FIG. 7.

In order to independently select the two cell strings CS11 and CS21 in the circuit diagram shown in FIG. 7, threshold voltages of the drain select transistors DST11, DST12, DST21, and DST22 may be set to different states ST1 and ST2. Referring to FIG. 8A, the threshold voltages of the drain select transistor DST11 of the cell string CS11 and the drain select transistor DST22 of the cell string CS21 are set to be included in the first state ST1, and the threshold voltages of the drain select transistor DST21 of the cell string CS21 and the drain select transistor DST12 of the cell string CS11 are set to be included in the second state ST2. Meanwhile, two turn-on voltages VON1 and VON2 may be used to independently select the two cell strings CS11 and CS21. A first turn-on voltage VON1 is a voltage that turns on the drain select transistors DST11 and DST22 of the first state ST1 and turns off the drain select transistors DST21 and DST12 of the second state ST2. Meanwhile, a second turn-on voltage VON2 is a voltage that turns on all of the drain select transistors DST11 and DST22 of the first state ST1 and the drain select transistors DST21 and DST12 of the second state ST2.

The two cell strings CS11 and CS21 may be independently selected by a combination of the first turn-on voltage VON1 and the second turn-on voltage VON2.

Referring to FIG. 8B, the combination of the first turn-on voltage VON1 and the second turn-on voltage VON2 for independently selecting the two cell strings CS11 and CS21 is shown as a table. For example, in a case where the cell string CS11 is to be selected, the first turn-on voltage VON1 is applied to the drain select line DSLa and the second turn-on voltage VON2 is applied to the drain select line DSLb. As the first turn-on voltage VON1 is applied to the drain select line DSLa, the drain select transistor DST11 of the cell string CS11 is turned on and the drain select transistor DST21 of the cell string CS21 is turned off. Meanwhile, as the second turn-on voltage VON2 is applied to the drain select line DSLb, both of the drain select transistor DST12 of the cell string CS11 and the drain select transistor DST22 of the cell string CS21 are turned on.

That is, in a case where the cell string CS11 is to be selected, as the first turn-on voltage VON1 is applied to the drain select line DSLa and the second turn-on voltage VON2 is applied to the drain select line DSLb, the select transistors DST11, DST12, and DST22 are turned on, and the drain select transistor DST21 is turned off. Since both of the drain select transistors DST11 and DST12 of the cell string CS11 are turned on, the selected cell string CS11 may operate. In addition, since the drain select transistor DST22 of the cell string CS21 is turned on, but the drain select transistor DST21 is turned off, the unselected cell string CS21 might not operate.

In a case where the cell string CS21 is to be selected, the second turn-on voltage VON2 is applied to the drain select line DSLa and the first turn-on voltage VON1 is applied to the drain select line DSLb. Therefore, the drain select transistors DST11, DST21, and DST22 are turned on, and the drain select transistor DST12 is turned off. Since both of the drain select transistors DST21 and DST22 of the cell string CS21 are turned on, the selected cell string CS21 may operate. In addition, since the drain select transistor DST11 of the cell string CS11 is turned on, but the drain select transistor DST12 is turned off, the unselected cell string CS11 might not operate.

Meanwhile, when both of the cell strings CS11 and CS21 are not selected, a turn-off voltage may be applied to the drain select lines DSLa and DSLb. The turn-off voltage may be a voltage that turns off all of the drain select transistors DST11, DST12, DST21, and DST22.

As described above, in a case where the cell string structure according to FIG. 7 is to be used, the threshold voltages of the drain select transistors DST21 and DST12 are required to be increased from the first state ST1, which is a low threshold voltage state at an initial stage of production, to the second state ST2. To this end, an electron may be implanted into a floating gate of the drain select transistors DST21 and DST12 using an ion implantation method during a production process of the memory cell array 110. However, according to such a method, in an embodiment, it is difficult to finely adjust the threshold voltage, and thus a threshold voltage distribution range of the drain select transistors DST21 and DST12 is widely formed. This, in an embodiment, makes it difficult to control the drain select transistors DST11, DST12, DST21, and DST22 of the cell strings CS11 and CS21.

According to an embodiment of the present disclosure, among the drain select transistors DST21 and DST12 of which the threshold voltages are required to be formed high, the threshold voltage of some drain select transistor is increased through an ion implantation method on the process, and the threshold voltage of another drain select transistor is increased through a programming method of the memory cell. Accordingly, in an embodiment, the threshold voltage distribution of some of the drain select transistors may be narrowed, and thus the drain select transistors DST11, DST12, DST21, and DST22 of the cell strings CS11 and CS21 may be more easily controlled.

Figure 9A:
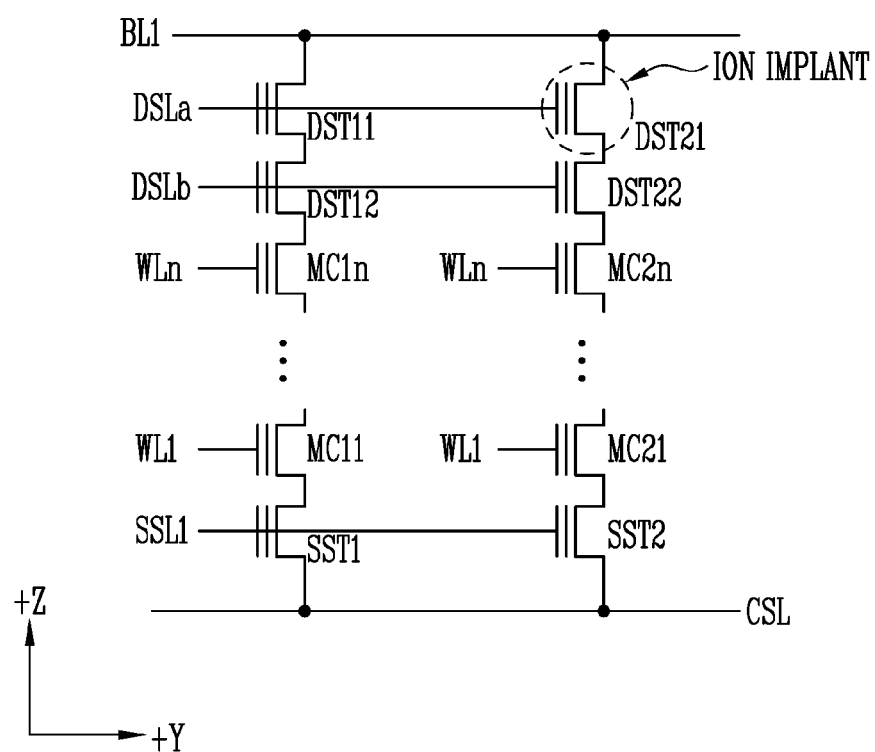
FIGS. 9A and 9B are diagrams illustrating a method of controlling a threshold voltage of any one of drain select transistors shown in FIG. 7.
Figure 9B:
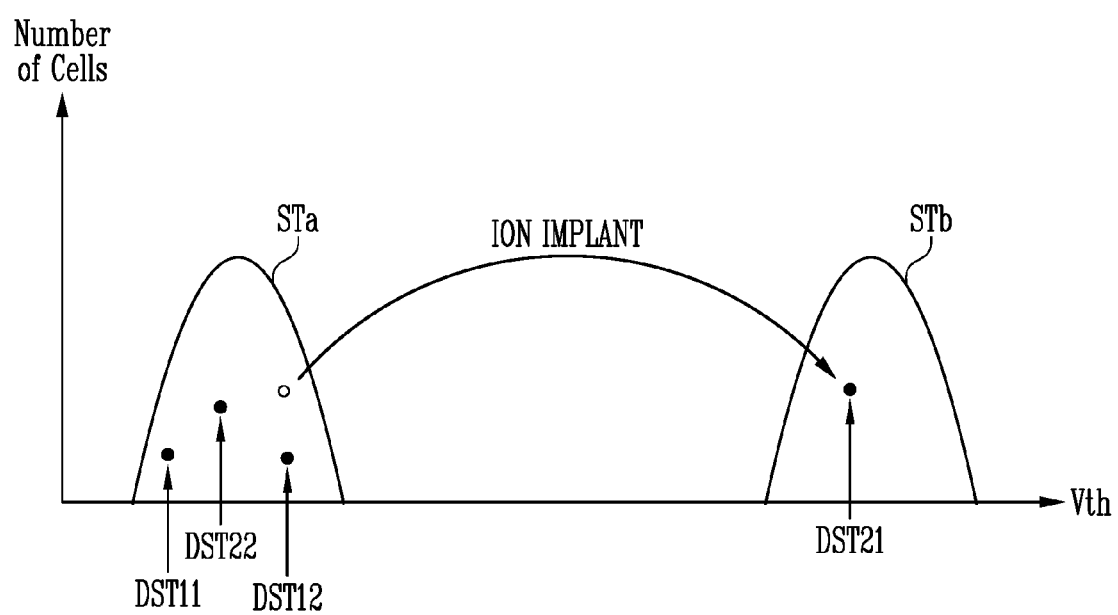

FIGS. 9A and 9B are diagrams illustrating a method of controlling a threshold voltage of any one of the drain select transistors shown in FIG. 7. Hereinafter, the present disclosure is described with reference to FIGS. 9A and 9B together.

Referring to FIG. 9A, among the drain select transistors DST21 and DST12 of which the threshold voltage is required to be formed high, the threshold voltage is increased using the ion implantation method to the drain select transistor DST21 positioned adjacent to the bit line BL1. In this case, as shown in FIG. 9B, the threshold voltage of the drain select transistor DST21 among the drain select transistors DST11, DST12, DST21, and DST22 having a threshold voltage of an initial 'a' state STa is increased to a 'b' state STb.

Figure 10A:
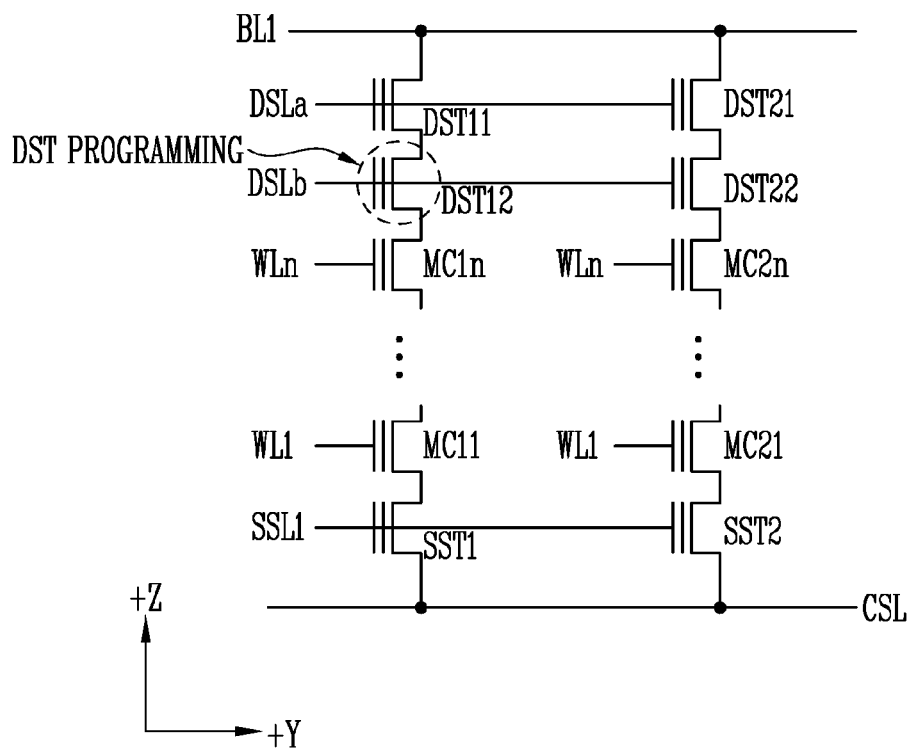
FIGS. 10A and 10B are diagrams illustrating a method of controlling a threshold voltage of another one of the drain select transistors shown in FIG. 7.
Figure 10B:
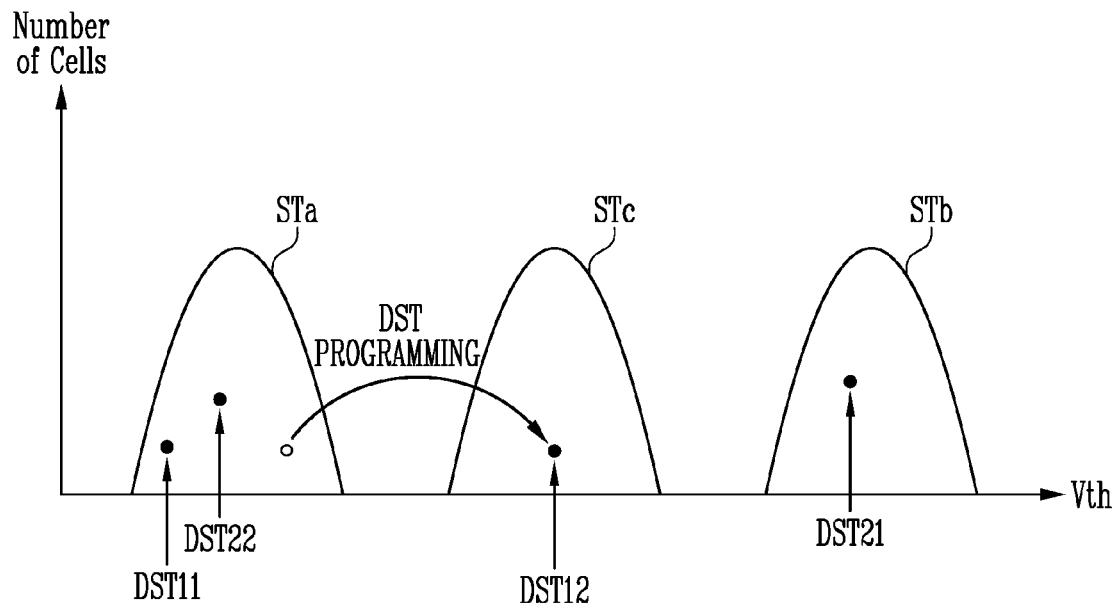

FIGS. 10A and 10B are diagrams illustrating a method of controlling a threshold voltage of another one of the drain select transistors shown in FIG. 7. Hereinafter, the present disclosure is described with reference to FIGS. 10A and 10B together.

As described with reference to FIGS. 9A and 9B, after the threshold voltage of the drain select transistor DST21 is increased to the 'b' state STb, the first turn-on voltage VON1 is applied to the drain select line DSLa. The first turn-on voltage VON1 is a voltage that turns on the drain select transistors DST11, DST12, and DST22 of the 'a' state STa and turns off the drain select transistor DST21 of the 'b' state STb. As the first turn-on voltage VON1 is applied to the drain select line DSLa, the drain select transistor DST11 is turned on and the drain select transistor DST21 is turned off. That is, the cell string CS21 is electrically isolated from the bit line BL1.

In a state in which the first turn-on voltage VON1 is applied to the drain select line DSLa, the drain select transistor DST12 is programmed. Specifically, the program allowable voltage is applied to the bit line BL1, a program pass voltage is applied to the word lines WL1 to WLn, and the program voltage is applied to the drain select line DSLb.

Since the drain select transistor DST21 is turned off, the cell string CS21 is in a program inhibit state. Even though the program voltage is applied to the drain select line DSLb in the program inhibit state, since the drain select transistor DST22 is electrically isolated from the bit line BL1, the threshold voltage of the drain select transistor DST22 does not increase.

On the other hand, since the drain select transistor DST11 is turned on, the cell string CS11 is in a program allow state. When the program voltage is applied to the drain select line DSLb in the program allow state, since the drain select transistor DST12 is electrically connected to the bit line BL1, the threshold voltage of the drain select transistor DST12 increases.

In an embodiment, the program voltage may be applied to the drain select line DSLb once. In another embodiment, the program voltage may be applied to the drain select line DSLb a plurality of times.

In this case, the program voltage of the same magnitude may be applied to the drain select line DSLb a plurality of times according to an embodiment. Alternatively, in another embodiment, a program voltage that is increased according to an incremental step pulse programming (ISPP) method may be applied to the drain select line DSLb a plurality of times.

According to an embodiment, an operation of verifying the threshold voltage of the drain select transistor DST12 may be performed between a plurality of program pulse apply operations. In another embodiment, a blind program method in which the threshold voltage of the drain select transistor DST12 is not verified may be used during the plurality of program pulse apply operations.

As the program voltage is applied to the drain select line DSLb, as shown in FIG. 10B, the threshold voltage of the drain select transistor DST12 among the drain select transistors DST11, DST12, and DST22 having the threshold voltage of the 'a' state STa increases to a 'c' state STc. In an embodiment, the 'c' state STc may correspond to a threshold voltage state that is higher than the 'a' state STa and lower than the 'b' state STb. However, this is an example, and according to an embodiment, the threshold voltage of the drain select transistor DST12 may be increased to the 'b' state STb.

Figure 11:
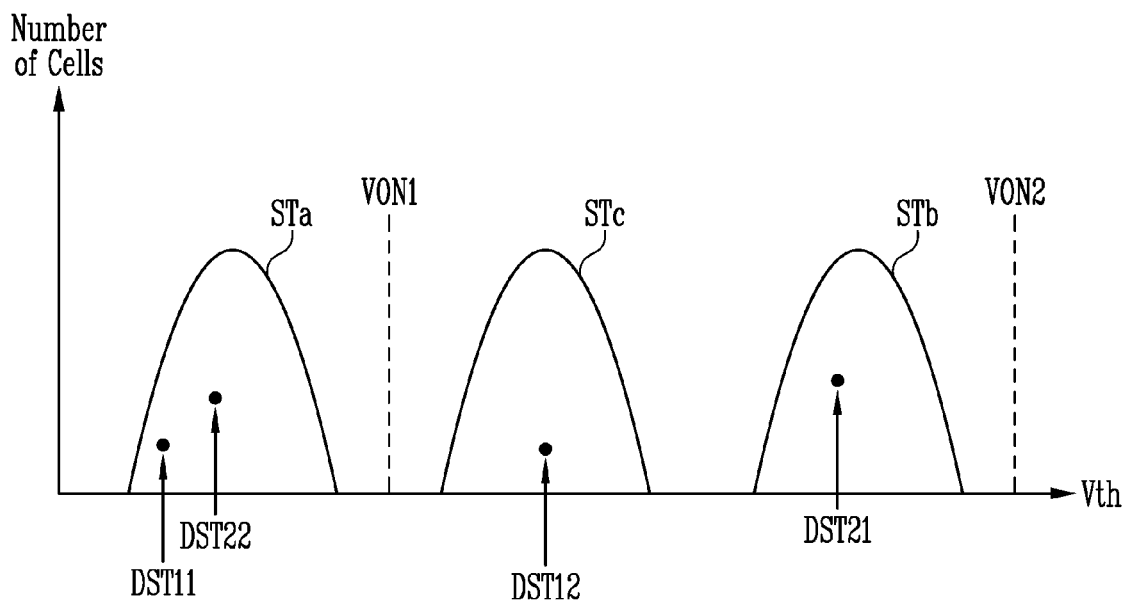
FIG. 11 is a diagram illustrating an embodiment of a method of operating the cell string after threshold voltage control described with reference to FIGS. 9A to 10B.

FIG. 11 is a diagram illustrating an embodiment of a method of operating the cell string after the threshold voltage control described with reference to FIGS. 9A to 10B.

Referring to FIG. 11, after the threshold voltages of the drain select transistors DST21 and DST12 are increased to the 'b' state STb and the 'c' state STc, respectively, the drain select transistors DST11, DST12, DST21, and DST22 may be controlled by using the first turn-on voltage VON1 and the second turn-on voltage VON2. In this case, the drain select transistors DST11, DST12, DST21, and DST22 may be controlled in a method identical to that described with reference to FIGS. 8A and 8B. That is, in a case where the cell string CS11 is to be selected, the first turn-on voltage VON1 may be applied to the drain select line DSLa and the second turn-on voltage VON2 may be applied to the drain select line DSLb. Meanwhile, in a case where the cell string CS21 is to be selected, the second turn-on voltage VON2 may be applied to the drain select line DSLa and the first turn-on voltage VON1 may be applied to the drain select line DSLb.

Figures 12A, 12B:
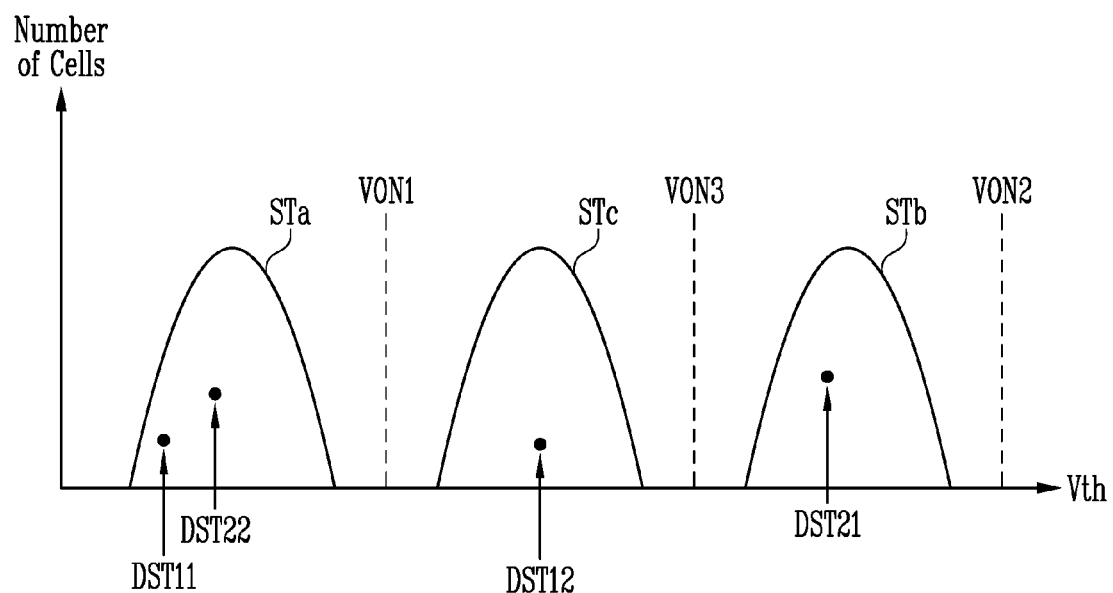
FIGS. 12A and 12B are diagrams illustrating another embodiment of a method of operating the cell string after the threshold voltage control described with reference to FIGS. 9A to 10B.

FIGS. 12A and 12B are diagrams illustrating another embodiment of a method of operating the cell string after the threshold voltage control described with reference to FIGS. 9A to 10B.

Referring to FIG. 12A, in addition to the first and second turn-on voltages VON1 and VON2, a third turn-on voltage VON3 may be additionally used. The third turn-on voltage VON3 may be greater than the first turn-on voltage VON1 and less than the second turn-on voltage VON2. The third turn-on voltage VON3 may be a voltage that turns on the drain select transistors DST11, DST12, and DST22 and turns off the drain select transistor DST21.

Referring to FIG. 12B, a combination of the first turn-on voltage VON1, the second turn-on voltage VON2, and the third turn-on voltage VON3 for independently selecting the two cell strings CS11 and CS21 is shown as a table. For example, in a case where the cell string CS11 is to be selected, the first turn-on voltage VON1 is applied to the drain select line DSLa and the third turn-on voltage VON3 is applied to the drain select line DSLb. As the first turn-on voltage VON1 is applied to the drain select line DSLa, the drain select transistor DST11 of the cell string CS11 is turned on and the drain select transistor DST21 of the cell string CS21 is turned off. Meanwhile, as the third turn-on voltage VON3 is applied to the drain select line DSLb, both of the drain select transistor DST12 of the cell string CS11 and the drain select transistor DST22 of the cell string CS21 are turned on.

That is, in a case where the cell string CS11 is to be selected, as the first turn-on voltage VON1 is applied to the drain select line DSLa and the third turn-on voltage VON3 is applied to the drain select line DSLb, the select transistors DST11, DST12, and DST22 are turned on, and the drain select transistor DST21 is turned off. Since both of the drain select transistors DST11 and DST12 of the cell string CS11 are turned on, the selected cell string CS11 may operate. In addition, since the drain select transistor DST22 of the cell string CS21 is turned on, but the drain select transistor DST21 is turned off, the unselected cell string CS21 might not operate.

In a case where the cell string CS21 is to be selected, the second turn-on voltage VON2 is applied to the drain select line DSLa and the first turn-on voltage VON1 is applied to the drain select line DSLb. Therefore, the drain select transistors DST11, DST21, and DST22 are turned on, and the drain select transistor DST12 is turned off. Since both of the drain select transistors DST21 and DST22 of the cell string CS21 are turned on, the selected cell string CS21 may operate. In addition, since the drain select transistor DST11 of the cell string CS11 is turned on, but the drain select transistor DST12 is turned off, the unselected cell string CS11 might not operate.

Referring to FIGS. 8B and 12B, in a case where the cell string CS11 is selected, the second turn-on voltage VON2 is applied to the drain select line DSLb in the embodiment of FIG. 8B, whereas the third turn-on voltage VON3 is applied to the drain select line DSLb in the embodiment of FIG. 12B.

Figure 13:
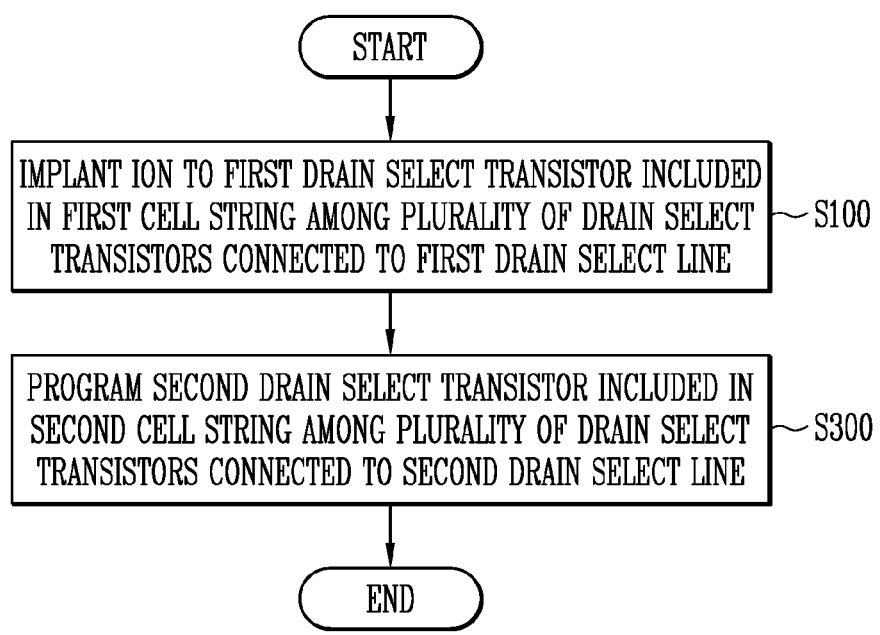
FIG. 13 is a flowchart illustrating a method of programming a select transistor according to an embodiment of the present disclosure.

FIG. 13 is a flowchart illustrating a method of programming a select transistor according to an embodiment of the present disclosure.

Referring to FIG. 13, the method of programming the select transistor according to an embodiment of the present disclosure includes implanting an ion to a first drain select transistor included in a first cell string among a plurality of drain select transistors connected to a first drain select line (S100), and programming a second drain select transistor included in a second cell string among a plurality of drain select transistors connected to a second drain select line (S300).

In step S100, as described with reference to FIGS. 9A and 9B, the threshold voltage of the first drain select transistor may be increased by implanting the ion to the first drain select transistor included in the first cell string. In an embodiment, in step S100, the ion may be implanted to a channel of the first drain select transistor included in the first cell string. The first drain select transistor of step S100 may be the drain select transistor positioned adjacent to the bit line among the plurality of drain select transistors included in the first cell string. The first cell string of step S100 corresponds to the cell string CS21 shown in FIG. 7, and the first drain select transistor corresponds to the drain select transistor DST21 shown in FIGS. 7 and 9A. As step S100 is performed, the threshold voltage of the first drain select transistor may increase to the 'b' state STb.

In step S300, as described with reference to FIGS. 10A and 10B, the second drain select transistor included in the second cell string may be programmed. The second drain select transistor of step S300 may be a drain select transistor connected to a drain select line different from the drain select line connected to the first drain select transistor.

The second cell string of step S300 corresponds to the cell string CS11 shown in FIG. 7, and the second drain select transistor corresponds to the drain select transistor DST12 shown in FIGS. 7 and 9A. As step S300 is performed, the threshold voltage of the second drain select transistor may increase to the 'c' state STc. However, this is an example, and as step S300 is performed, the threshold voltage of the second drain select transistor may increase to the 'b' state STb.

Figure 14:
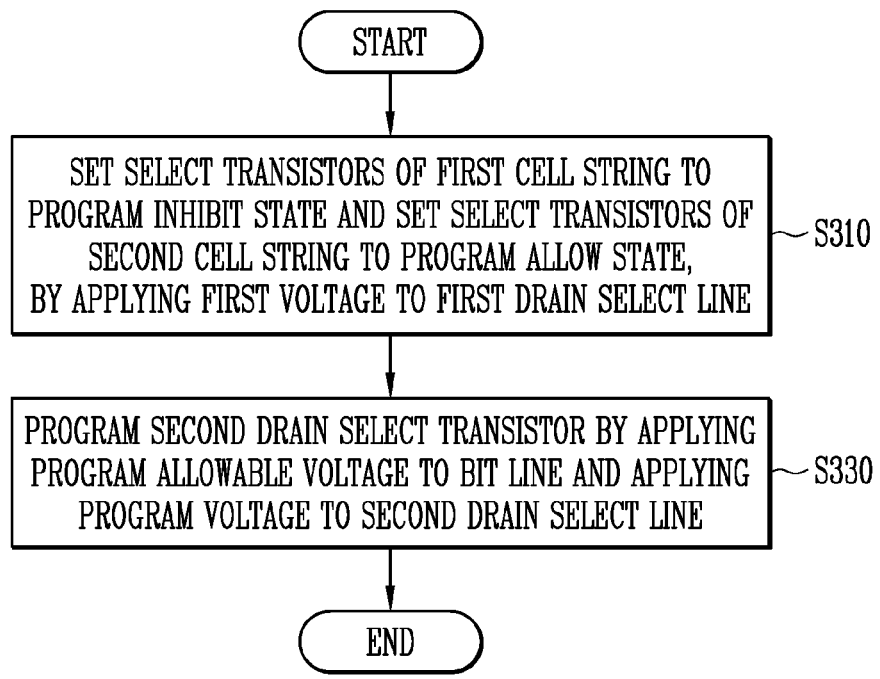
FIG. 14 is a flowchart illustrating an embodiment of step S300 of FIG. 13.

FIG. 14 is a flowchart illustrating an embodiment of step S300 of FIG. 13.

Referring to FIG. 14, programming the second drain select transistor included in the second cell string (S300) includes applying a first voltage to the first drain select line to set select transistors of the first cell string to the program inhibit state and set select transistors of the second cell string to the program allow state (S310), and applying the program allowable voltage to the bit line and applying the program voltage to the second drain select line to program the second drain select transistor (S330).

In step S310, the first drain select line may correspond to the drain select line DSLa of FIG. 9A, and the first voltage may correspond to the first turn-on voltage VON1 shown in FIG. 8A or 11. As the first voltage is applied to the first drain select line, the first cell string is set to the program inhibit state and the second cell string is set to the program allow state.

In step S330, the second drain select line may correspond to the drain select line DSLb of FIG. 9A. As the program voltage is applied to the second drain select line, the second drain select transistor included in the second cell string of the program allow state is programmed. As step S330 is performed, the threshold voltage of the second drain select transistor may increase to the 'c' state STc. However, this is an example, and as step S330 is performed, the threshold voltage of the second drain select transistor may increase to the 'b' state STb.

Figure 15A:
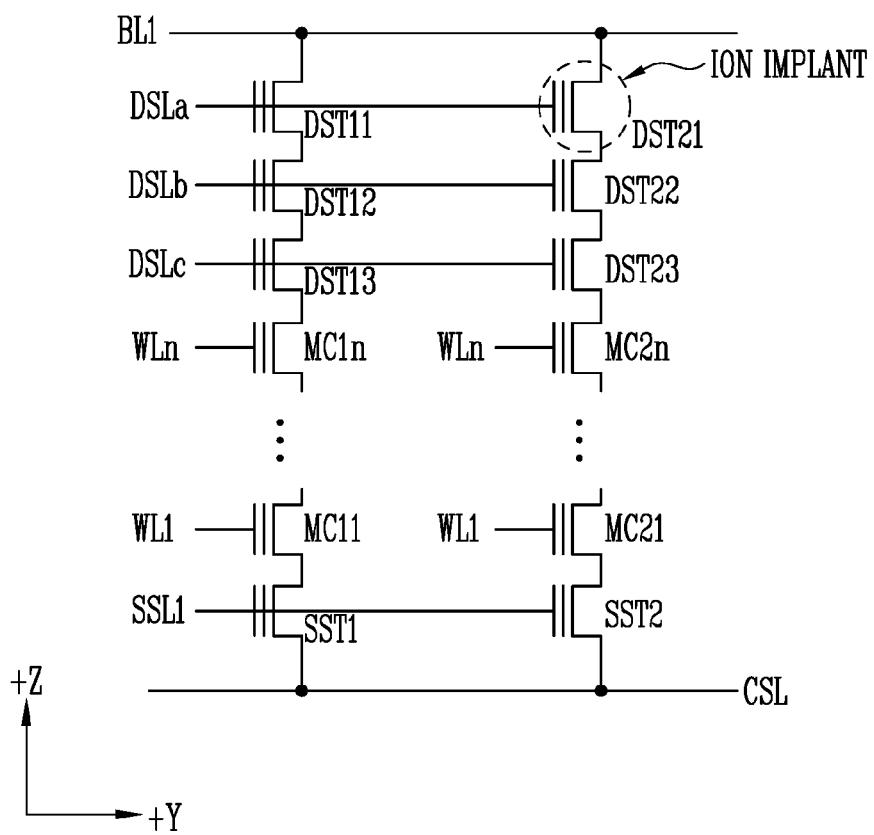
FIGS. 15A and 15B are diagrams illustrating a method of controlling a threshold voltage of any one of drain select transistors included in first and second string groups according to another embodiment of the present disclosure.
Figure 15B:
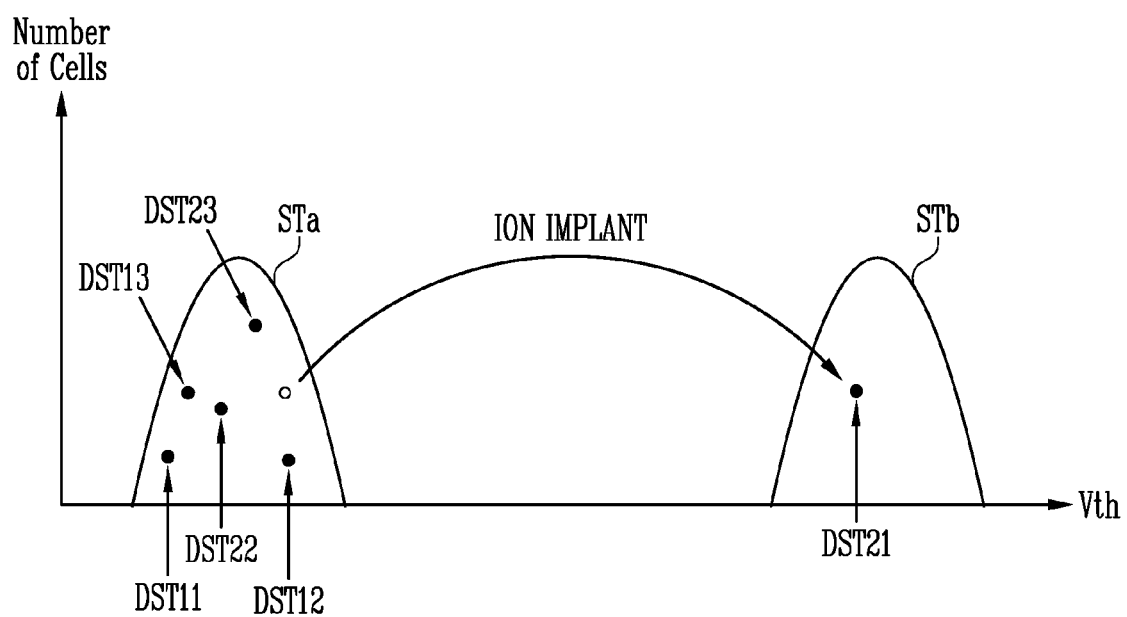

FIGS. 15A and 15B are diagrams illustrating a method of controlling a threshold voltage of any one of drain select transistors included in first and second string groups according to another embodiment of the present disclosure. Hereinafter, the present disclosure is described with reference to FIGS. 15A and 15B together.

Referring to FIG. 15A, each of the cell strings includes three drain select transistors. The cell string CS11 includes drain select transistors DST11, DST12, and DST13, and the cell string CS21 includes drain select transistors DST21, DST22, and DST23. First, as shown in FIG. 15A, a threshold voltage of the drain select transistor DST21 may be increased by implanting an ion to the drain select transistor DST21 positioned adjacent to the bit line BL1 among the drain select transistors DST21, DST22, and DST23 included in the cell string CS21. In an embodiment, the ion may be implanted to a channel of the drain select transistor DST21 positioned adjacent to the bit line BL1. In this case, as shown in FIG. 15B, the threshold voltage of the drain select transistor DST21 among the drain select transistors DST11, DST12, DST13, DST21, DST22, and DST23 having the threshold voltage of the initial 'a' state STa increases to the cb' state STb.

Figure 16A:
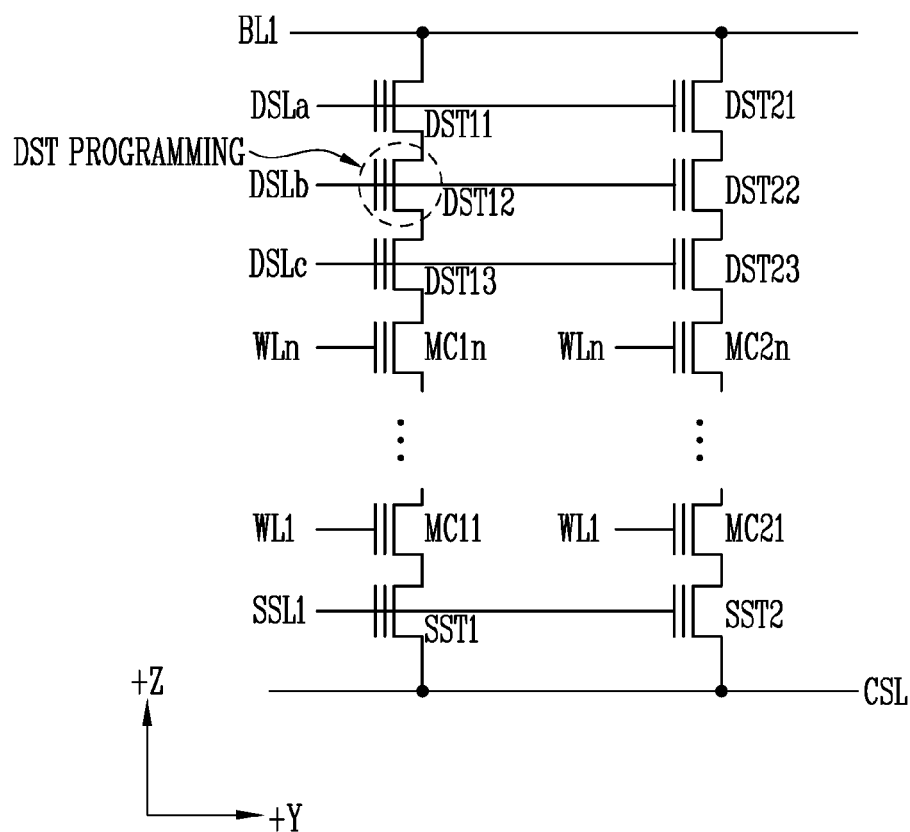
FIGS. 16A and 16B are diagrams illustrating a method of controlling a threshold voltage of another one of drain select transistors included in first and second string groups according to another embodiment of the present disclosure.
Figure 16B:
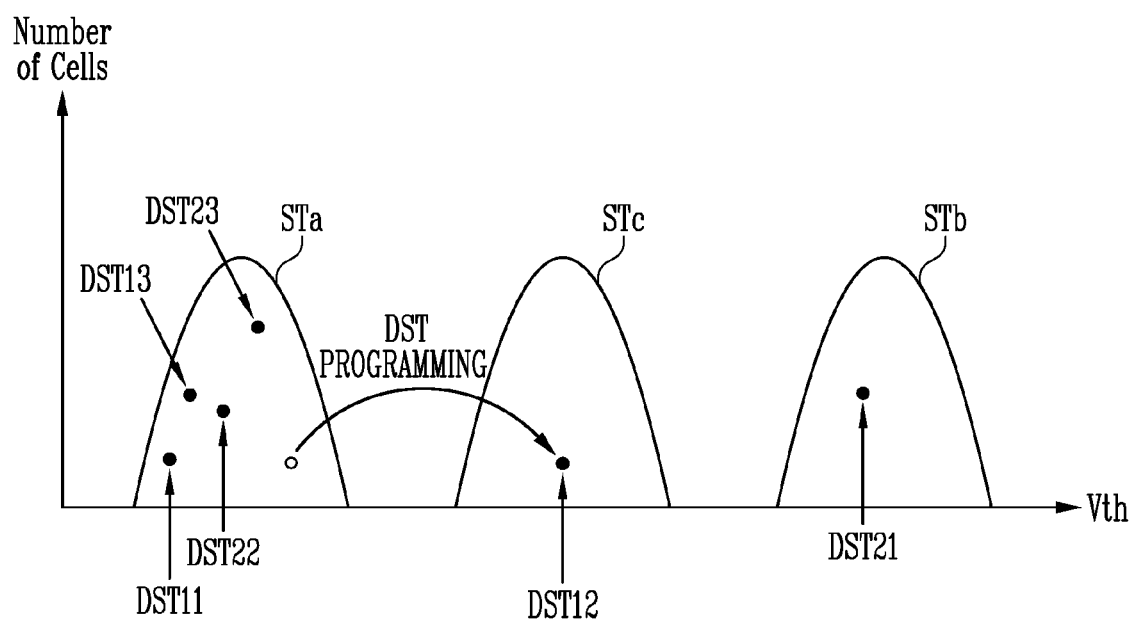

FIGS. 16A and 16B are diagrams illustrating a method of controlling a threshold voltage of another one of drain select transistors included in first and second string groups according to another embodiment of the present disclosure. Hereinafter, the present disclosure is described with reference to FIGS. 16A and 16B together.

As described with reference to FIGS. 15A and 15B, after the threshold voltage of the drain select transistor DST21 is increased to the 'b' state STb, the first turn-on voltage VON1 is applied to the drain select line DSLa. The first turn-on voltage VON1 is a voltage that turns on the drain select transistors DST11, DST12, DST13, DST22, and DST23 of the 'a' state STa and turns off the drain select transistor DST21 of the 'b' state STb. As the first turn-on voltage VON1 is applied to the drain select line DSLa, the drain select transistor DST11 is turned on and the drain select transistor DST21 is turned off. That is, the cell string CS21 is electrically isolated from the bit line BL1.

In a state in which the first turn-on voltage VON1 is applied to the drain select line DSLa, the drain select transistor DST12 is programmed. Specifically, the program allowable voltage is applied to the bit line BL1, the program pass voltage is applied to the drain select line DSLc and the word lines WL1 to WLn, and the program voltage is applied to the drain select line DSLb.

Since the drain select transistor DST21 is turned off, the cell string CS21 is in the program inhibit state. Even though the program voltage is applied to the drain select line DSLb in the program inhibit state, since the drain select transistor DST22 is electrically isolated from the bit line BL1, the threshold voltage of the drain select transistor DST22 does not increase.

On the other hand, since the drain select transistor DST11 is turned on, the cell string CS11 is in the program allow state. When the program voltage is applied to the drain select line DSLb in the program allow state, since the drain select transistor DST12 is electrically connected to the bit line BL1, the threshold voltage of the drain select transistor DST12 increases.

Meanwhile, since the program pass voltage is applied to the drain select line DSLc, the threshold voltages of the drain select transistors DST13 and DST23 do not increase.

As the program voltage is applied to the drain select line DSLb, as shown in FIG. 16B, the threshold voltage of the drain select transistor DST12 among the drain select transistors DST11, DST12, DST13, DST22, and DST23 having the threshold voltage of the 'a' state STa increases to the 'c' state STc. In an embodiment, the 'c' state STc may correspond to a threshold voltage state higher than the 'a' state STa and lower than the 'b' state STb. However, this is an example, and according to an embodiment, the threshold voltage of the drain select transistor DST12 may be increased to the 'b' state STb.

Figure 17A:
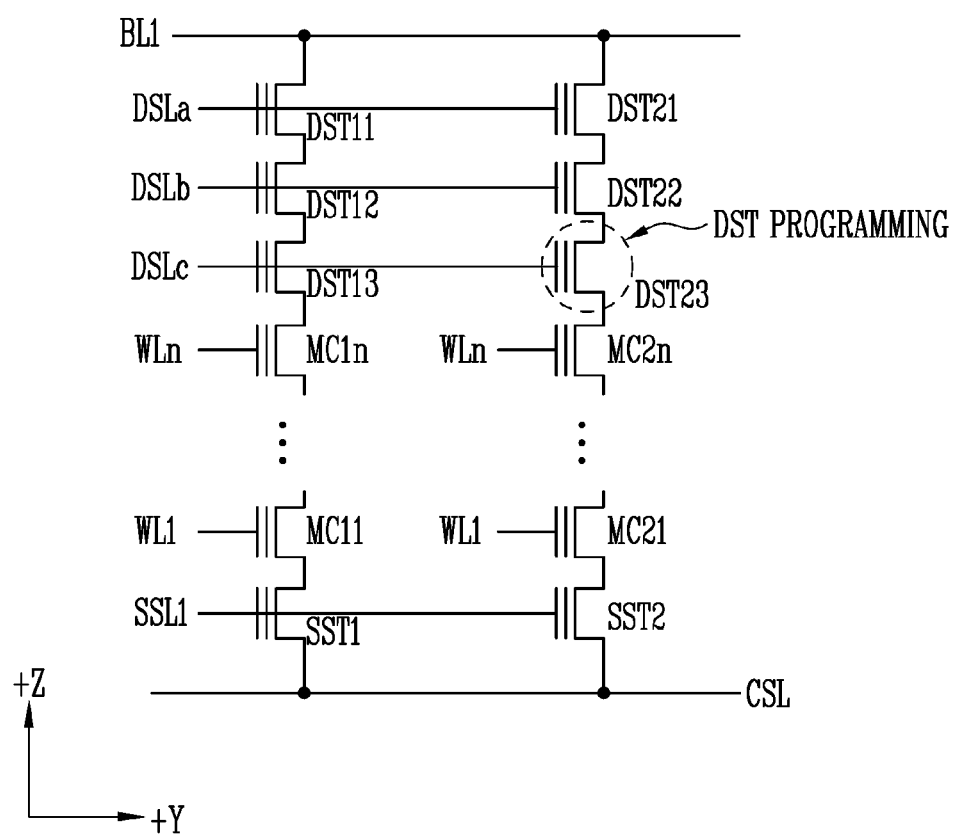
FIGS. 17A and 17B are diagrams illustrating a method of controlling a threshold voltage of still another one among drain select transistors included in first and second string groups according to another embodiment of the present disclosure.
Figure 17B:
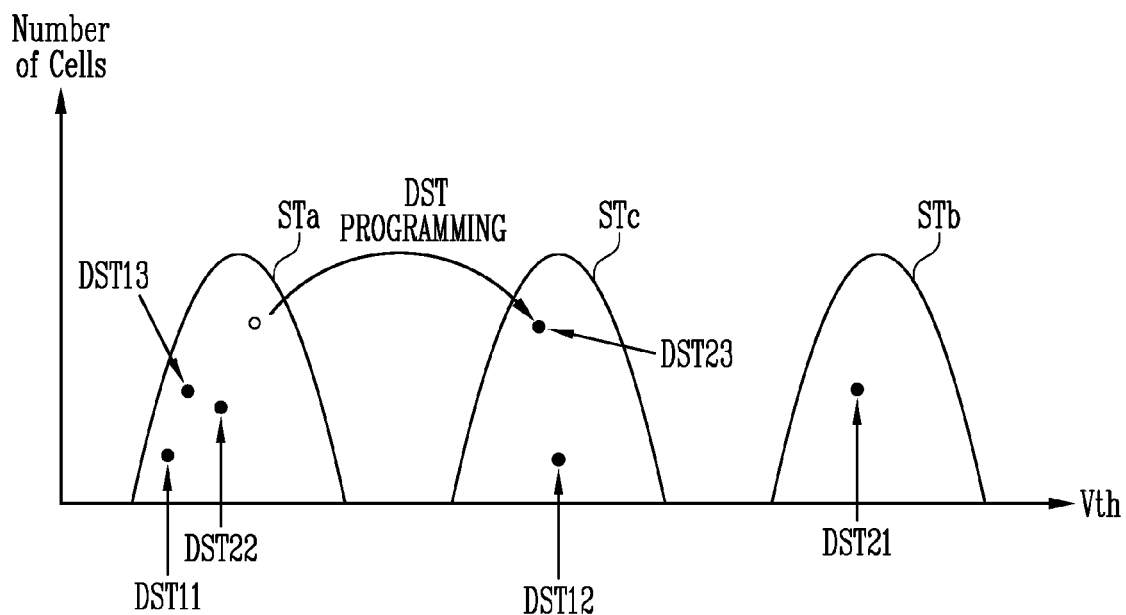

FIGS. 17A and 17B are diagrams illustrating a method of controlling a threshold voltage of still another one among drain select transistors included in first and second string groups according to another embodiment of the present disclosure. Hereinafter, the present disclosure is described with reference to FIGS. 17A and 17B together.

As described with reference to FIGS. 16A and 16B, after the threshold voltage of the drain select transistor DST12 is increased to the 'c' state STc, the second turn-on voltage VON2 is applied to the drain select line DSLa. As the second turn-on voltage VON2 is applied to the drain select line DSLa, both of the drain select transistors DST11 and DST21 are turned on.

In a state in which the second turn-on voltage VON2 is applied to the drain select line DSLa, the first turn-on voltage VON1 is applied to the drain select line DSLb. As shown in FIG. 11, the first turn-on voltage VON1 is a voltage that turns on the drain select transistor of the 'a' state STa and turns off the drain select transistor of the 'b' state STb. As the first turn-on voltage VON1 is applied to the drain select line DSLb, the drain select transistor DST22 is turned on and the drain select transistor DST12 is turned off.

Thereafter, the drain select transistor DST23 is programmed. Specifically, the program allowable voltage is applied to the bit line BL1, the program pass voltage is applied to the word lines WL1 to WLn, and the program voltage is applied to the drain select line DSLc.

Since the drain select transistor DST12 is turned off, the cell string CS11 is in the program inhibit state. Even though the program voltage is applied to the drain select line DSLc in the program inhibit state, since the drain select transistor DST13 is electrically isolated from the bit line BL1, the threshold voltage of the drain select transistor DST13 does not increase.

On the other hand, since the drain select transistors DST21 and DST22 are turned on, the cell string CS21 is in the program allow state. When the program voltage is applied to the drain select line DSLc in the program allow state, since the drain select transistor DST23 is electrically connected to the bit line BL1, the threshold voltage of the drain select transistor DST23 increases.

As the program voltage is applied to the drain select line DSLc, as shown in FIG. 17B, the threshold voltage of the drain select transistor DST23 among the drain select transistors DST11, DST13, DST22, and DST23 having the threshold voltage of the 'a' state STa increases to the 'c' state STc. However, this is an example, and according to an embodiment, the threshold voltage of the drain select transistor DST23 may be increased to the 'b' state STb.

Figure 18A:
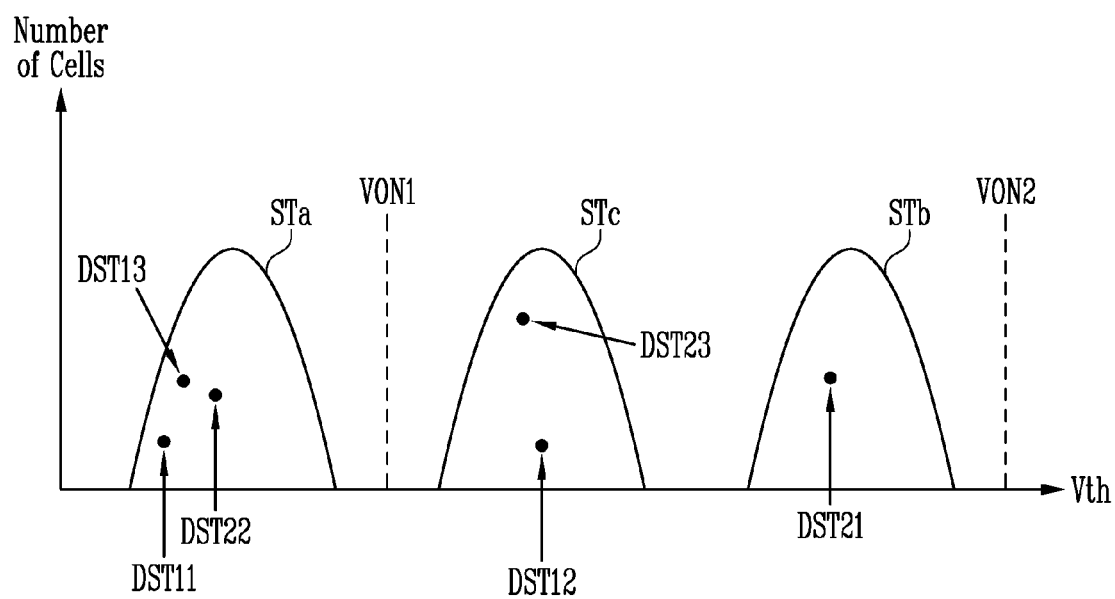
Figures 18B, 19A:
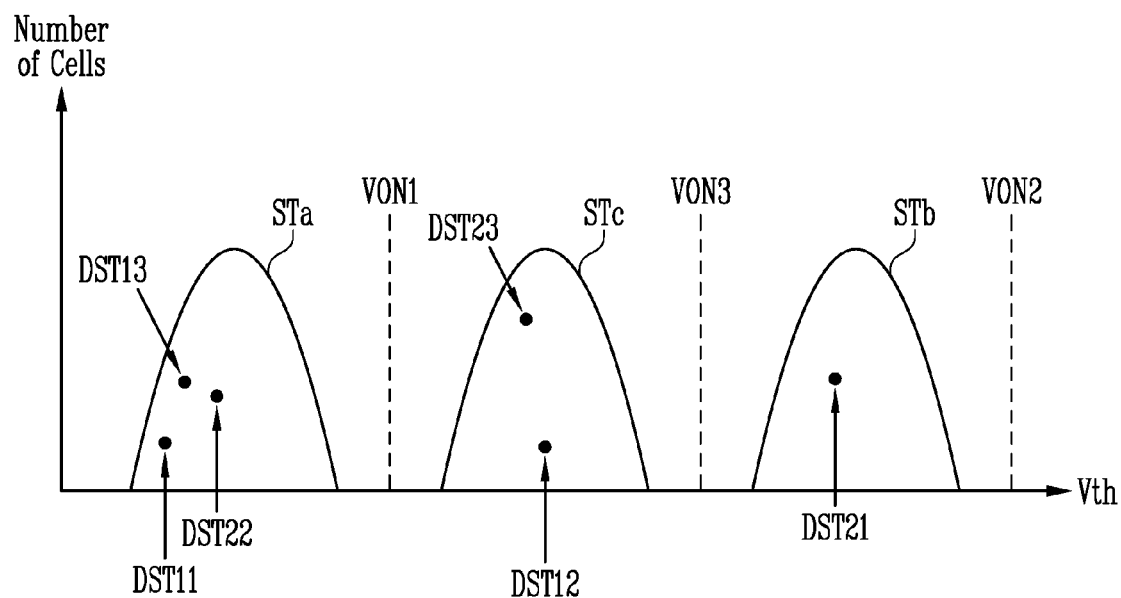

FIGS. 18A and 18B are diagrams illustrating an embodiment of a method of operating the cell string after the threshold voltage control described with reference to FIGS. 15A to 17B.

Referring to FIG. 18A, after the threshold voltage of the drain select transistor DST21 is increased to the 'b' state STb and the threshold voltages of the drain select transistors DST12 and DST23 is increased to the 'c' state STc, the drain select transistors DST11, DST12, DST13, DST21, DST22, and DST23 may be controlled using the first turn-on voltage VON1 and the second turn-on voltage VON2.

In this case, as a table shown in FIG. 18B, the drain select transistors DST11, DST12, DST13, DST21, DST22, and DST23 may be controlled. That is, in a case where the cell string CS11 is to be selected, the first turn-on voltage VON1 may be applied to the drain select line DSLa, the second turn-on voltage VON2 may be applied to the drain select line DSLb, and the first turn-on voltage may be applied to the drain select line DSLc. In this case, the drain select transistors DST11, DST12, DST22, and DST13 are turned on, and the drain select transistors DST21 and DST23 are turned off. Accordingly, the selected cell string CS11 may operate and the unselected cell string CS21 might not operate.

Meanwhile, in a case where the cell string CS21 is to be selected, the second turn-on voltage VON2 may be applied to the drain select line DSLa, the first turn-on voltage VON1 may be applied to the drain select line DSLb, and the second turn-on voltage may be applied to the drain select line DSLc. In this case, the drain select transistors DST11, DST21, DST22, DST13, and DST23 are turned on, and the drain select transistor DST12 are turned off. Accordingly, the selected cell string CS21 may operate and the unselected cell string CS11 might not operate.

FIGS. 19A and 19B are diagrams illustrating another embodiment of a method of operating the cell string after the threshold voltage control described with reference to FIGS. 15A to 17B.

Referring to FIG. 19A, in addition to the first and second turn-on voltages VON1 and VON2, the third turn-on voltage VON3 may be additionally used. The third turn-on voltage VON3 may be greater than the first turn-on voltage VON1 and less than the second turn-on voltage VON2. The third turn-on voltage VON3 may be a voltage that turns on the drain select transistors DST11, DST12, DST13, DST22, and DST23 and turns off the drain select transistor DST21.

Referring to FIG. 19B, a combination of the first turn-on voltage VON1, the second turn-on voltage VON2, and the third turn-on voltage VON3 for independently selecting the two cell strings CS11 and CS21 is shown as a table. For example, in a case where the cell string CS11 is to be selected, the first turn-on voltage VON1 is applied to the drain select line DSLa, the third turn-on voltage VON3 is applied to the drain select line DSLb, and the first turn-on voltage VON1 is applied to the drain select line DSLc. In this case, the drain select transistors DST11, DST12, DST22, and DST13 are turned on, and the drain select transistors DST21 and DST23 are turned off. Accordingly, the selected cell string CS11 may operate and the unselected cell string CS21 might not operate.

Meanwhile, in a case where the cell string CS21 is to be selected, the second turn-on voltage VON2 may be applied to the drain select line DSLa, the first turn-on voltage VON1 may be applied to the drain select line DSLb, and the second turn-on voltage may be applied to the drain select line DSLc. In this case, the drain select transistors DST11, DST21, DST22, DST13, and DST23 are turned on, and the drain select transistor DST12 is turned off. Accordingly, the selected cell string CS21 may operate and the unselected cell string CS11 might not operate.

Referring to FIGS. 18B and 19B, when the cell string CS11 is selected, the second turn-on voltage VON2 is applied to the drain select line DSLb in the embodiment of FIG. 18B, whereas the third turn-on voltage VON3 is applied to the drain select line DSLb in the embodiment of FIG. 19B.

FIG. 20 is a flowchart illustrating a method of programming a select transistor according to another embodiment of the present disclosure.

Referring to FIG. 20, the method of programming the select transistor according to another embodiment of the present disclosure includes implanting an ion to a first drain select transistor included in a first cell string among a plurality of drain select transistors connected to a first drain select line (S101), programming a second drain select transistor included in a second cell string among a plurality of drain select transistors connected to a second drain select line (S301), and programming a third drain select transistor included in the first cell string among a plurality of drain select transistors connected to a third drain select line (S501).

In step S101, as described with reference to FIGS. 15A and 15B, the threshold voltage of the first drain select transistor may be increased by implanting the ion to the first drain select transistor included in the first cell string. In an embodiment, the ion may be implanted to a channel of the first drain select transistor included in the first cell string. The first drain select transistor of step S101 may be the drain select transistor positioned adjacent to the bit line among the plurality of drain select transistors included in the first cell string. The first drain select transistor of step S101 corresponds to the drain select transistor DST21 shown in FIG. 15A. As step S101 is performed, the threshold voltage of the first drain select transistor may increase to the 'b' state STb.

In step S301, as described with reference to FIGS. 16A and 16B, the second drain select transistor included in the second cell string may be programmed. The second drain select transistor of step S301 may be a drain select transistor connected to a drain select line different from the drain select line connected to the first drain select transistor.

The second drain select transistor of step S301 corresponds to the drain select transistor DST12 shown in FIG. 16A. As step S301 is performed, the threshold voltage of the second drain select transistor may increase to the 'c' state STc. However, this is an example, and as step S301 is performed, the threshold voltage of the second drain select transistor may increase to the 'b' state STb.

In step S501, as described with reference to FIGS. 17A and 17B, the third drain select transistor included in the first cell string may be programmed. The third drain select transistor of step S501 may be a drain select transistor connected to a drain select line different from the drain select lines connected to the first and second drain select transistors, respectively.

The third drain select transistor of step S501 corresponds to the drain select transistor DST23 shown in FIG. 17A. As step S301 is performed, the threshold voltage of the third drain select transistor may increase to the 'c' state STc. However, this is an example, and as step S301 is performed, the threshold voltage of the third drain select transistor may increase to the 'b' state STb.

Figure 21:
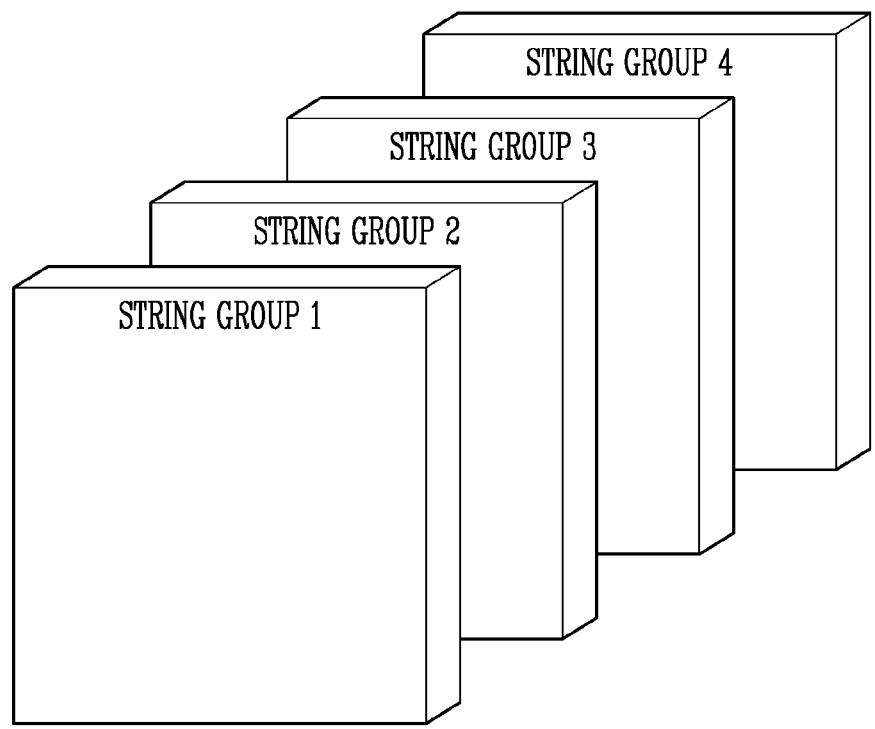
FIG. 21 is a diagram illustrating another example of a string group configuring a memory block.

FIG. 21 is a diagram illustrating another example of the string group configuring the memory block.

Referring to FIG. 21, the memory block may include four string groups STRING GROUP 1 to STRING GROUP 4. As described above with reference to FIG. 5, the string group included in the memory block may be defined as cell strings sharing the drain select line or the source select line. Although the memory block shown in FIG. 5 includes two string groups, the memory block may be configured to include the four string groups as shown in FIG. 21. Meanwhile, although the method of programming the drain select transistor included in the two string groups is described with reference to FIGS. 5 to 20, a drain select transistor included in the four string groups as shown in FIG. 21 may also be programmed in a similar method.

Figure 22:
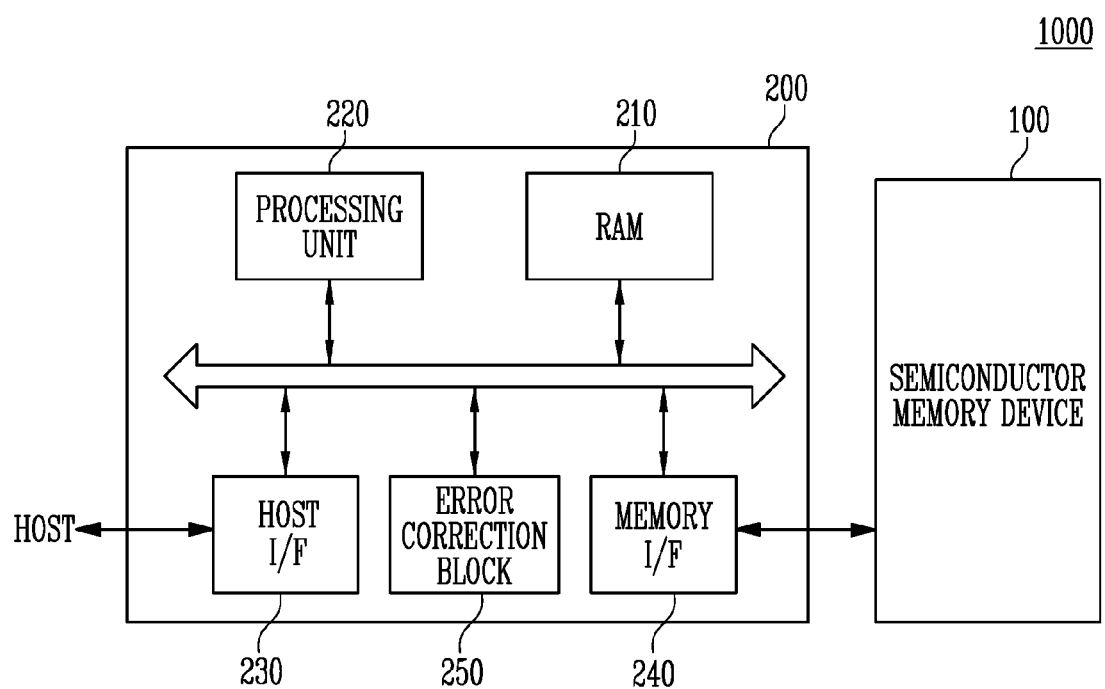
FIG. 22 is a block diagram illustrating an embodiment of a memory system 1000 including the semiconductor memory device 100 of FIG. 1.

FIG. 22 is a block diagram illustrating an embodiment of a memory system 1000 including the semiconductor memory device 100 of FIG. 1.

Referring to FIG. 22, the memory system 1000 includes the semiconductor memory device 100 and a controller 200. The semiconductor memory device 100 may be the semiconductor memory device described with reference to FIG. 1.

The controller 200 is connected to a host Host and the semiconductor memory device 100. The controller 200 is configured to access the semiconductor memory device 100 in response to a request from the host Host. For example, the controller 200 is configured to control read, write, erase, and background operations of the semiconductor memory device 100. The controller 200 is configured to provide an interface between the semiconductor memory device 100 and the host Host. The controller 200 is configured to drive firmware for controlling the semiconductor memory device 100.

The controller 200 includes a random access memory (RAM) 210, a processing unit 220, a host interface 230, a memory interface 240, and an error correction block 250. The RAM 210 is used as at least one of an operation memory of the processing unit 220, a cache memory between the semiconductor memory device 100 and the host Host, and a buffer memory between the semiconductor memory device 100 and the host Host. The processing unit 220 controls an overall operation of the controller 200. In addition, the controller 200 may temporarily store program data provided from the host Host during the write operation.

The host interface 230 includes a protocol for performing data exchange between the host Host and the controller 200. As an embodiment, the controller 200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 240 interfaces with the semiconductor memory device 100. For example, the memory interface 240 includes a NAND interface or a NOR interface.

The error correction block 250 is configured to detect and correct an error of data received from the semiconductor memory device 100 using an error correcting code (ECC). The processing unit 220 may control the semiconductor memory device 100 to adjust the read voltage according to an error detection result of the error correction block 250 and perform re-reading. As an embodiment, the error correction block may be provided as a component of the controller 200.

The controller 200 and the semiconductor memory device 100 may be integrated into one semiconductor device. As an embodiment, the controller 200 and the semiconductor memory device 100 may be integrated into one semiconductor device to form a memory card. For example, the controller 200 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 200 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), in an embodiment, an operation speed of the host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an embodiment, the semiconductor memory device 100 or the memory system 1000 may be mounted as a package of various types. For example, the semiconductor memory device 1300 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC) package, a shrink small outline package (SSOP), a thin small outline package (TSOP), a system in package (SIP), a multi-chip package (MCP), a wafer-level fabricated package (WFP), or a wafer-level processed stack package (WSP).

Figure 23:
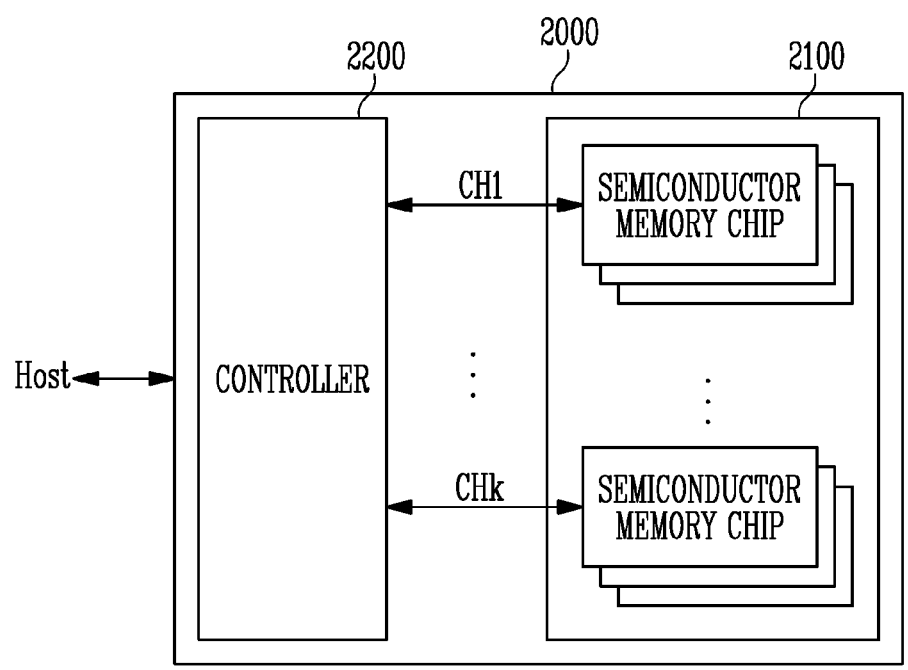
FIG. 23 is a block diagram illustrating an application example of the memory system of FIG. 22.

FIG. 23 is a block diagram illustrating an application example of the memory system of FIG. 22.

Referring to FIG. 23, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 23, the plurality of groups communicate with the controller 2200 through first to k-th channels CH1 to CHk, respectively. Each semiconductor memory chip may be configured and operated similarly to the semiconductor memory devices 100 described with reference to FIG. 1.

Each group is configured to communicate with the controller 2200 through one common channel. The controller 2200 is configured similarly to the controller 200 described with reference to FIG. 22 and is configured to control the plurality of memory chips of the semiconductor memory device 2100 through the plurality of channels CH1 to CHk.

Figure 24:
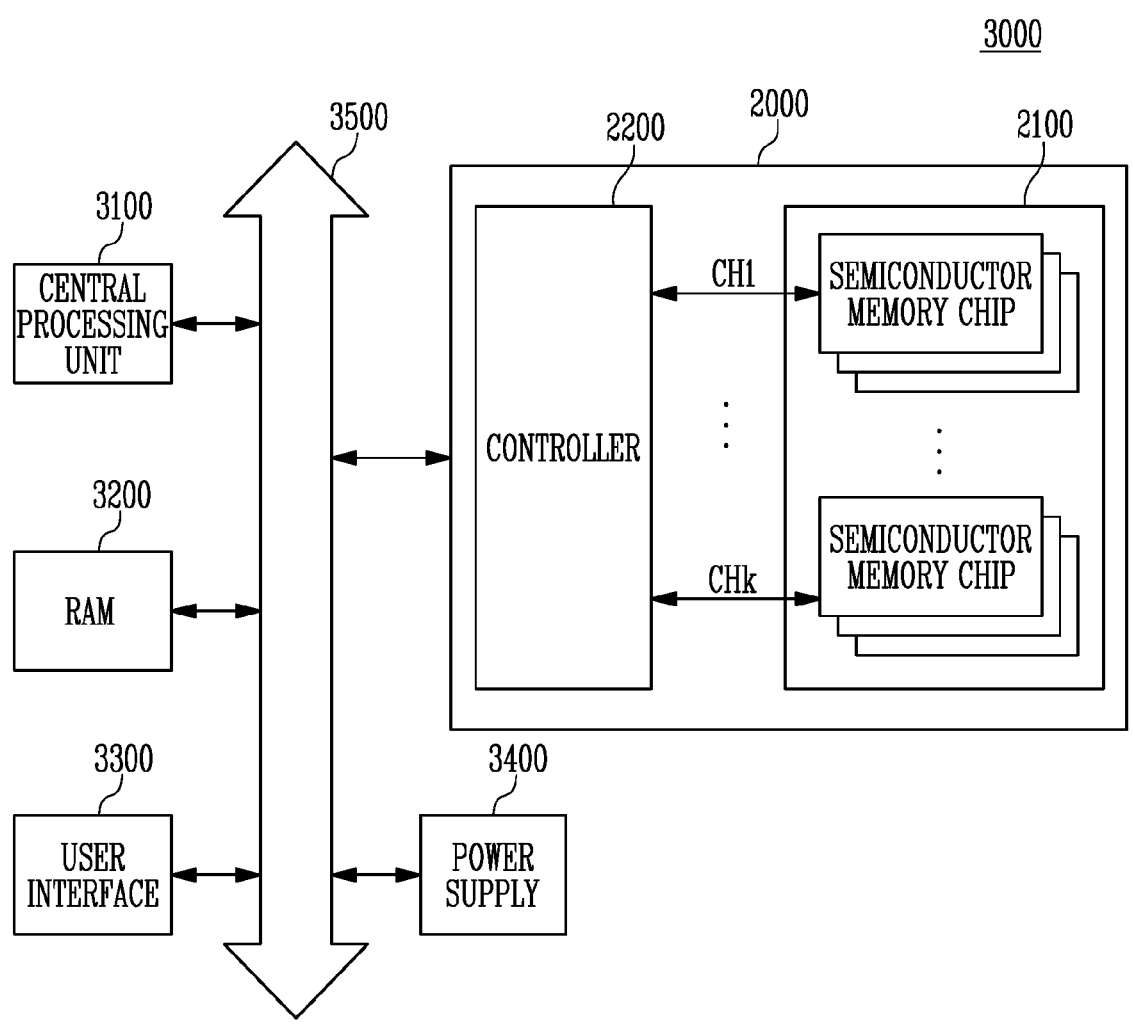
FIG. 24 is a block diagram illustrating a computing system including the memory system described with reference to FIG. 23.

FIG. 24 is a block diagram illustrating a computing system including the memory system described with reference to FIG. 23.

The computing system 3000 includes a central processing unit 3100, a random access memory (RAM) 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data provided through the user interface 3300 or processed by the central processing unit 3100 is stored in the memory system 2000.

In FIG. 24, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing unit 3100 and the RAM 3200.

In FIG. 24, the memory system 2000 described with reference to FIG. 23 is provided. However, the memory system 2000 may be replaced with the memory system 1000 described with reference to FIG. 22. As an embodiment, the computing system 3000 may be configured to include both of the memory systems 1000 and 2000 described with reference to FIGS. 22 and 23.

The embodiments of the present disclosure disclosed in the present specification and drawings are merely specific examples for describing the technical content of the present disclosure and facilitating understanding of the present disclosure and do not limit the scope of the present disclosure. It is apparent to a person skilled in the art to which the present disclosure pertains that other modifications based on the technical spirit of the present disclosure may be carried out in addition to the embodiments disclosed herein.

What is claimed is:

1. A semiconductor memory device comprising:
a first cell string including first and second drain select transistors;
a second cell string including third and fourth drain select transistors;
a peripheral circuit configured to perform a program operation on the fourth drain select transistor included in the second cell string; and
control logic configured to control the program operation of the peripheral circuit,
wherein gates of the first and third drain select transistors are connected to a first drain select line, gates of the second and fourth drain select transistors are connected to a second drain select line,
each threshold voltage of the second and third drain select transistors corresponds to a first threshold voltage distribution, each threshold voltage of the first and fourth drain select transistors is higher than the first threshold voltage distribution,
the threshold voltage of the first drain select transistor is set through an ion implantation process,
the threshold voltage of the fourth drain select transistor is set through the program operation, and
the threshold voltage of the first drain select transistor corresponds to a second threshold voltage distribution higher than the first threshold voltage distribution, and the threshold voltage of the fourth drain select transistor corresponds to a third threshold voltage distribution higher than the first threshold voltage distribution and lower than the second threshold voltage distribution.

2. The semiconductor memory device of claim 1, wherein the first and third drain select transistors are positioned adjacent to a bit line.

3. The semiconductor memory device of claim 1, wherein after the threshold voltage of the first drain select transistor increases to the second threshold voltage distribution through the ion implantation process, a first turn-on voltage higher than the first threshold voltage distribution and lower than the third threshold voltage distribution is applied to the first drain select line, and the threshold voltage of the fourth drain select transistor is set by applying a program voltage to the second drain select line.

4. The semiconductor memory device of claim 3, wherein when selecting the first cell string, the control logic controls the peripheral circuit to apply a second turn-on voltage higher than the second threshold voltage distribution to the first drain select transistor and apply the first turn-on voltage to the second drain select transistor.

5. The semiconductor memory device of claim 3, wherein when selecting the second cell string, the control logic controls the peripheral circuit to apply the first turn-on voltage to the first drain select transistor and apply a third turn-on voltage higher than the third threshold voltage distribution and lower than the second threshold voltage distribution to the second drain select transistor.

6. The semiconductor memory device of claim 3, wherein when selecting the second cell string, the control logic controls the peripheral circuit to apply the first turn-on voltage to the first drain select transistor and apply a second turn-on voltage higher than the second threshold voltage distribution to the second drain select transistor.

7. The semiconductor memory device of claim 1,
wherein the first cell string further includes a fifth drain select transistor, the second cell string further includes a sixth drain select transistor,
wherein a threshold voltage of the fifth drain select transistor is higher than the first threshold voltage distribution, a threshold voltage of the sixth drain select transistor corresponds to the first threshold voltage distribution, and
wherein the peripheral circuit is configured to perform the program operation on the fifth drain select transistor to set the threshold voltage of the fifth drain select transistor.

8. A method of programming a drain select transistor included in a semiconductor memory device, the method comprising:
implanting an ion into a first drain select transistor included in a first cell string among first and second drain select transistors connected to a first drain select line;

programming a fourth drain select transistor included in a second cell string among third and fourth drain select transistors connected to a second drain select line; and maintaining a first threshold voltage distribution of each of the second drain select transistor and the third drain select transistor.

9. The method of claim 8, wherein the second drain select transistor is included in the second cell string, the third drain select transistor is included in the first cell string, and the first and second cell strings are connected to the same bit line.

10. The method of claim 9, wherein the first drain select transistor is positioned adjacent to the bit line.

11. The method of claim 10, wherein a threshold voltage of the first drain select transistor increases from the first threshold voltage distribution to a second threshold voltage distribution by the implanting of the ion into the first drain select transistor included in the first cell string among the first and second drain select transistors connected to the first drain select line.

12. The method of claim 11, wherein the programming of the fourth drain select transistor comprises:

turning off the first drain select transistor and turning on the second drain select transistor by applying a first voltage higher than the first threshold voltage distribution and lower than the second threshold voltage distribution to the first drain select line; and applying a program allowable voltage to the bit line and applying a program voltage to the second drain select line.

13. The method of claim 12, wherein a threshold voltage of the fourth drain select transistor increases to the second threshold voltage distribution by applying the program allowable voltage to the bit line and applying the program voltage to the second drain select line.

14. The method of claim 12, wherein a threshold voltage of the fourth drain select transistor increases from the first threshold voltage distribution to a third threshold voltage distribution higher than the first threshold voltage distribution and lower than the second threshold voltage distribution by applying the program allowable voltage to the bit line and applying the program voltage to the second drain select line.

15. The method of claim 14, further comprising:

programming a fifth drain select transistor included in the first cell string among fifth and sixth drain select transistors connected to a third drain select line.

16. The method of claim 15, wherein the programming of the fifth drain select transistor comprises:

turning on the first and second drain select transistors by applying a second voltage higher than the second threshold voltage distribution to the first drain select line;

turning off the fourth drain select transistor and turning on the third drain select transistor by applying the first voltage higher than the first threshold voltage distribution and lower than the third threshold voltage distribution to the second drain select line; and applying the program allowable voltage to the bit line and applying the program voltage to the third drain select line.

\* \* \* \* \*